United States Patent
Jaklic

(10) Patent No.: US 10,620,531 B1
(45) Date of Patent: Apr. 14, 2020

(54) ERROR-CONTROLLED DISCRETIZATION OF PARAMETRIC CURVES FOR INTEGRATED CIRCUIT DESIGN AND MANUFACTURE

(71) Applicant: Cadence Design Systems, Inc., San Jose, CA (US)

(72) Inventor: Janez Jaklic, Feldkirchen (DE)

(73) Assignee: CADENCE DESIGN SYSTEMS, INC., San Jose, CA (US)

(*) Notice: Subject to any disclaimer, the term of this patent is extended or adjusted under 35 U.S.C. 154(b) by 43 days.

(21) Appl. No.: 16/165,887

(22) Filed: Oct. 19, 2018

(51) Int. Cl.
| G06F 17/50 | (2006.01) |
| G03F 1/70 | (2012.01) |
| G06T 7/00 | (2017.01) |
| G06F 30/30 | (2020.01) |

(52) U.S. Cl.
CPC .......... *G03F 1/70* (2013.01); *G06F 30/30* (2020.01); *G06T 7/0006* (2013.01); *G06T 7/0008* (2013.01); *G06T 2207/30148* (2013.01)

(58) Field of Classification Search
USPC .... 716/50, 51, 52, 53, 54, 55, 129, 115, 108
See application file for complete search history.

(56) References Cited

U.S. PATENT DOCUMENTS

| 7,346,886 B2* | 3/2008 | Fukagawa | G03F 7/70433 716/50 |
| 2003/0065494 A1* | 4/2003 | Croix | G06F 30/33 703/2 |
| 2003/0083764 A1* | 5/2003 | Hong | G05B 19/40932 700/98 |
| 2006/0230365 A1* | 10/2006 | Bromberger | G06F 30/36 716/115 |
| 2007/0226668 A1* | 9/2007 | Dasdan | G06F 30/3312 716/108 |
| 2008/0024499 A1 | 1/2008 | Bateman | |
| 2009/0324093 A1 | 12/2009 | Miarecki et al. | |

(Continued)

OTHER PUBLICATIONS

Li, W., et al., "Global Topological Changes of Offset Domains", 2011 Eigth International Symposium on Voronoi Diagrams in Science and Engineering, IEEE, pp. 83-90.

*Primary Examiner* — Brian Ngo
(74) *Attorney, Agent, or Firm* — McDermott Will & Emery LLP

(57) ABSTRACT

A method including receiving a parametrized curve indicative of a feature in an integrated circuit is provided. The method includes selecting a first parameter value associated with a first point in the parametrized curve, determining a pre-selected number of derivative values in a Taylor series for the parametrized curve at the first point, and determining a second parameter value for a second point in the parametrized curve based on the pre-selected number of derivative values. The method also includes determining a threshold error value between a straight segment joining the first point and the second point, and the parametrized curve, modifying the second parameter value based on the threshold error value and a pre-selected tolerance, transforming the parametrized curve into a discretized segmentation that comprises the straight segment joining the first point and the second point, and providing the discretized segmentation of the parametrized curve to manufacture a mask for reproducing the feature in the integrated circuit.

20 Claims, 14 Drawing Sheets

(56) References Cited

U.S. PATENT DOCUMENTS

| | | | |
|---|---|---|---|
| 2011/0022219 A1* | 1/2011 | Saied | G03F 1/36 |
| | | | 700/121 |
| 2012/0017193 A1* | 1/2012 | Ou | G06F 30/39 |
| | | | 716/129 |
| 2014/0321165 A1* | 10/2014 | Albea Sanchez | G06F 1/3206 |
| | | | 363/1 |
| 2018/0239860 A1* | 8/2018 | Allen | G06F 30/327 |

* cited by examiner

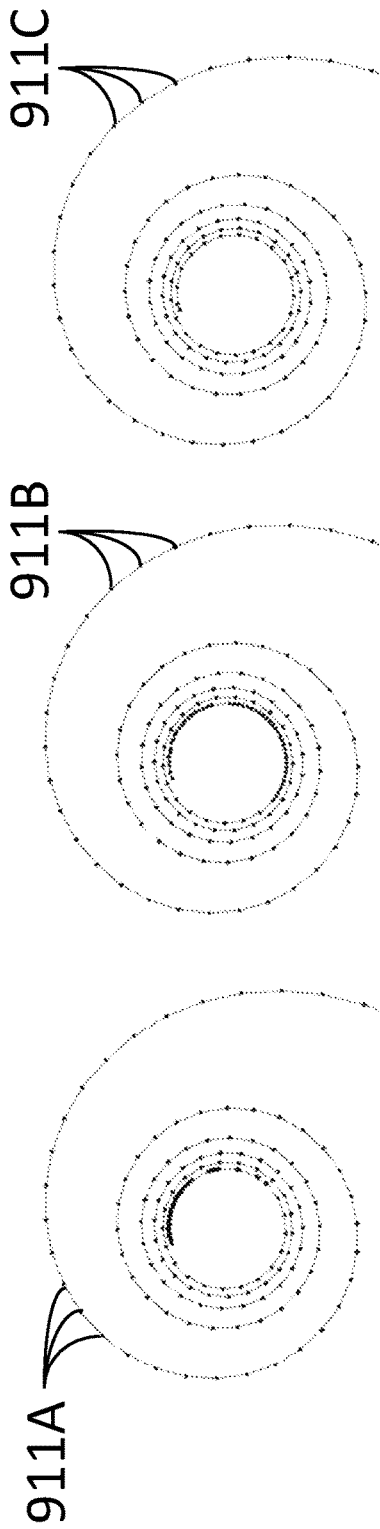
FIG. 9A
FIG. 9B
FIG. 9C
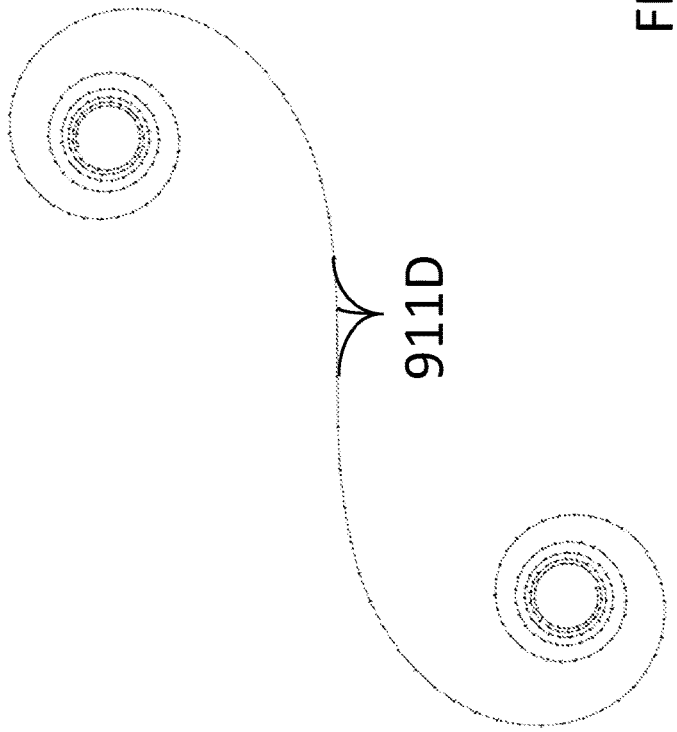
FIG. 9D

1022

| Curve Discretization | |
|---|---|
| x(t)= | 4*cos(t)-0.4*exp(cos(4*t)) |
| y(t)= | 4*sin(t)+0.4*exp(sin(5*t)) |
| t1= | 0 |
| t2= | 6.28319 |
| epsilon= | 0.1 |
| N= | 3 |
| beta= | 1.0 |

Discretize    Help

FIG. 10

ERROR-CONTROLLED DISCRETIZATION OF PARAMETRIC CURVES FOR INTEGRATED CIRCUIT DESIGN AND MANUFACTURE

TECHNICAL FIELD

Embodiments described herein are generally related to the field of mask modeling and fabrication for integrated circuit (IC) design and fabrication. More specifically, embodiments described herein are related to providing discretized linear segments of arbitrary shapes for mask manufacturing in IC design and fabrication.

BACKGROUND

In integrated circuit (IC) design, mask fabrication is a critical step for reproducing circuit features with high fidelity. Current trends in IC fabrication include active and passive optical components that may have stringent geometrical specifications for adequate device performance. While electronic performance may be more flexible in terms of accurate geometrical fidelity with an IC design, the optical components are less tolerant to shape errors and deviations from the prescribed model. Moreover, the shapes of optically active or passive components may deviate from the more traditional rectilinear or square type electronic components. Accordingly, it is desirable to develop methods and system to accurately transfer such sophisticated shapes and features to a mask for IC fabrication.

The description provided in the background section should not be assumed prior art merely because it is mentioned in or associated with the background section. The background section may include information that describes one or more aspects of the subject technology.

SUMMARY

In a first embodiment, a computer-implemented method is disclosed that includes receiving a parametrized curve indicative of a feature in an integrated circuit. The computer-implemented method also includes selecting a first parameter value associated with a first point in the parametrized curve, determining a pre-selected number of derivative values in a Taylor series for the parametrized curve at the first point, and determining a second parameter value for a second point in the parametrized curve based on the pre-selected number of derivative values. The computer-implemented method also includes determining a threshold error value between a straight segment joining the first point and the second point, and the parametrized curve, and modifying the second parameter value based on the threshold error value and a pre-selected tolerance. The computer-implemented method also includes transforming the parametrized curve into a discretized segmentation that comprises the straight segment joining the first point and the second point, and providing the discretized segmentation of the parametrized curve to manufacture a mask for reproducing the feature in the integrated circuit.

In a second embodiment, a system is disclosed that includes a memory storing instructions and one or more processors configured to execute the instructions to cause the system to receive a parametrized curve indicative of a feature in an integrated circuit. The one or more processors also execute instructions to select a first parameter value associated with a first point in the parametrized curve, to determine a pre-selected number of derivative values in a Taylor series for the parametrized curve at the first point, to determine a second parameter value for a second point in the parametrized curve based on the pre-selected number of derivative values, and to determine a threshold error value between a straight segment joining the first point and the second point, and the parametrized curve. The one or more processors also execute instructions to modify the second parameter value based on the threshold error value and a pre-selected tolerance, to transform the parametrized curve into a discretized segmentation that includes the straight segment joining the first point and the second point, and to provide the discretized segmentation of the parametrized curve to manufacture a mask for reproducing the feature in the integrated circuit.

In yet another embodiment, a non-transitory, machine-readable storage medium is disclosed that includes instructions which, when executed by a processor, cause a computer to perform a method. The method includes receiving a parametrized curve indicative of a feature in an integrated circuit. The method also includes selecting a first parameter value associated with a first point in the parametrized curve, determining a pre-selected number of derivative values in a Taylor series for the parametrized curve at the first point, and determining a second parameter value for a second point in the parametrized curve based on the pre-selected number of derivative values. The method also includes determining a threshold error value between a straight segment joining the first point and the second point, and the parametrized curve, and modifying the second parameter value based on the threshold error value and a pre-selected tolerance. The method also includes transforming the parametrized curve into a discretized segmentation that includes the straight segment joining the first point and the second point, and providing the discretized segmentation of the parametrized curve to manufacture a mask for reproducing the feature in the integrated circuit.

In a further embodiment, a system is disclosed that includes a means to store instructions and a means to execute the instructions to cause the system to perform a method. The method includes receiving a parametrized curve indicative of a feature in an integrated circuit. The method also includes selecting a first parameter value associated with a first point in the parametrized curve, determining a pre-selected number of derivative values in a Taylor series for the parametrized curve at the first point, and determining a second parameter value for a second point in the parametrized curve based on the pre-selected number of derivative values. The method also includes determining a threshold error value between a straight segment joining the first point and the second point, and the parametrized curve, and modifying the second parameter value based on the threshold error value and a pre-selected tolerance. The method also includes transforming the parametrized curve into a discretized segmentation that includes the straight segment joining the first point and the second point, and providing the discretized segmentation of the parametrized curve to manufacture a mask for reproducing the feature in the integrated circuit.

BRIEF DESCRIPTION OF THE DRAWINGS

The accompanying drawings, which are included to provide further understanding and are incorporated in and constitute a part of this specification, illustrate disclosed embodiments, and together with the description, serve to explain the principles of the disclosed embodiments. In the drawings:

FIGS. 9A-D illustrates a discretized segmentation of a Cornu spiral, according to some embodiments.

FIG. 10 illustrates a query table for a user of an application to generate discretized segmented representations of arbitrary parametric curves, according to some embodiments.

Figure 1:
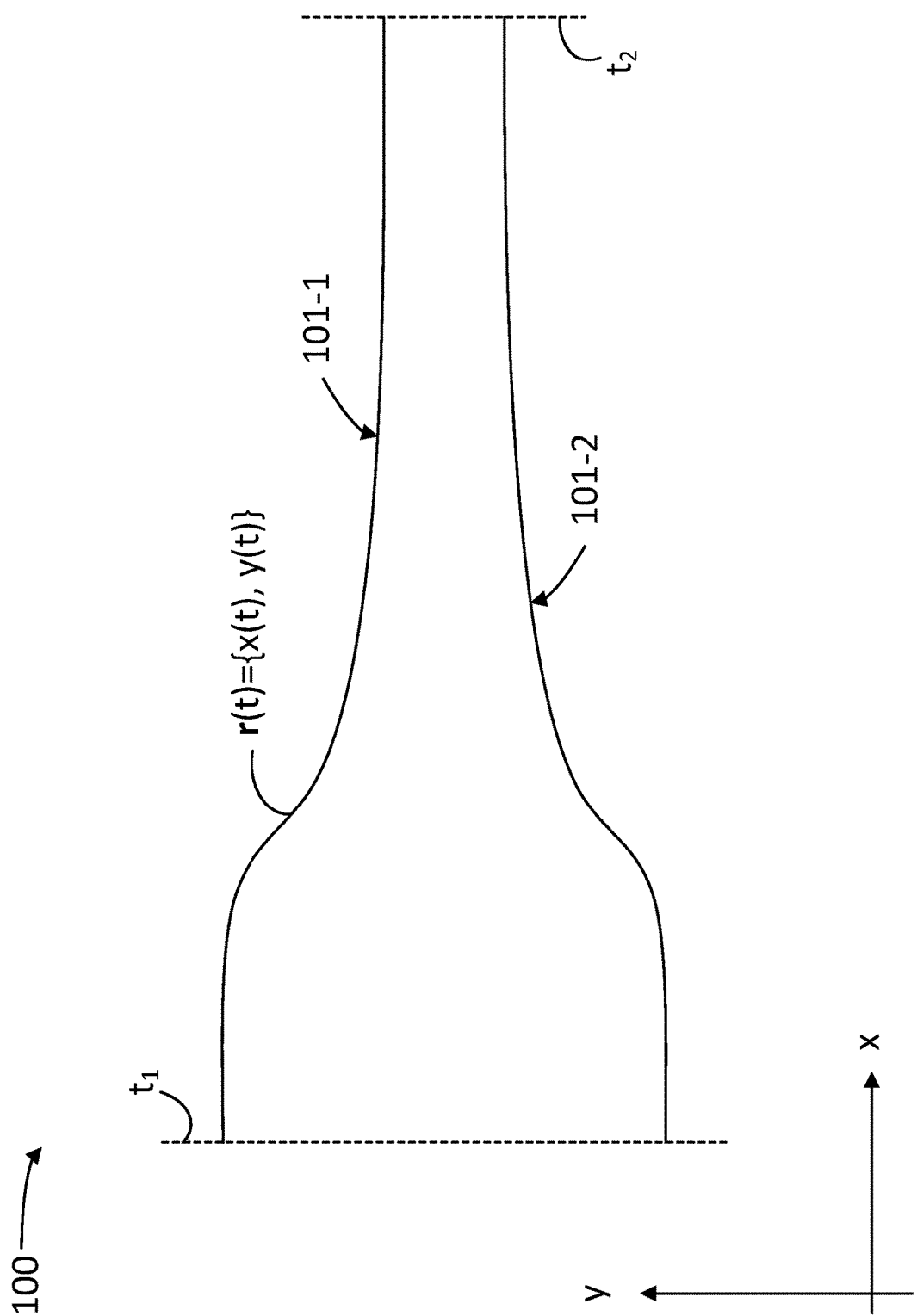
FIG. 1 illustrates a schematic of a circuit feature for an IC design, according to some embodiments.

In the figures, elements and steps denoted by the same or similar reference numerals are associated with the same or similar elements and steps, unless indicated otherwise. In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject disclosure.

DETAILED DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and descriptions are to be regarded as illustrative in nature and not restrictive.

General Overview

The disclosed system provides a method for error-controlled discretization of arbitrary parametric curves defined by analytic functions based on the Taylor series expansion is presented. In the predictive step, the curve is approximated by the Taylor series and the discretization step calculated to minimize the number of discretization points while still remaining within the maximum error bounds. In the corrective step, the error due to the deviation of the Taylor series from the actual curve is estimated and the discretization step decreased if the total estimated error would exceed the maximum error bounds. The method requires the calculation of the derivatives of the curve functions only at the discretization points, which we accomplish by symbolic derivation and evaluation. The method has been tested on the examples of curves exhibiting large variations of curvatures, small variations on short length scales, and singular points such as cusps resulting from parallel curve translation. In all cases, the discretization error re-mains below discretization tolerance, demonstrating the reliability of the method for curve discretization. At the same time, the large variation of the discretization step shows the sensitivity of the method to the smallest variations of the curve function and its efficiency in minimizing the number of discretization points.

The disclosed system addresses a technical problem tied to computer technology and arising in the realm of computer aided design and manufacturing (CAD/CAM) and computer graphics, namely the technical problem of converting layouts represented by parametric curves to a discretized form that can be processed by other CAD/CAM and manufacturing tools. The disclosed system solves this problem by implementing a discretized segmentation that closely resembles the parametric curve, thereby reducing the problem to that of manipulating multiple line segments. This allows for the computation of as few discretization points as possible for parametric curves having arbitrary shape to a desired resolution, without exceeding a given tolerance nor exhausting of valuable computational resources.

Embodiments as disclosed herein provide a solution to the above technical problem by performing a Taylor series approximation to the parametric curves over arbitrarily small line segments, and then determining whether the segmented curve approximates the parametric curve within a desired accuracy.

Embodiments as disclosed herein greatly enhance the performance of a computer by reducing the computational burden and processing time of handling arbitrarily complex curves (e.g., for mask modeling and fabrication of IC circuits) without exhausting computational resources.

FIG. 1 illustrates a schematic of a circuit feature 100 for an IC design, according to some embodiments. Feature 100 is delimited by a first parametric curve 101-1 and a second parametric curve 101-2 in a plane (e.g., the XY plane). Geometrical objects in Computer Aided Design systems are usually represented using certain classes of curves. Typically these would include lines, conic sections (circular and elliptic arcs) and polynomial splines in mechanical design, lines and circular arcs in printed circuit board design, and only lines in integrated circuit design. The restriction to certain classes of curves applies not only to design tools, but also to data formats used for exchanging manufacturing information. Although this is not a limitation in the original design domain, for some applications geometrical representation by more general classes of curves is needed. For example, integrated circuit layout design tools are now not only used for designing electrical devices and interconnect, but also structures in other types of technologies that can be implemented on silicon, such as silicon photonics, MEMS and microfluidics. The geometries of such devices typically need to adhere to certain smoothness requirements or even be a mathematical solution of some underlying physical model, therefore they may not be satisfactorily described by any of the predetermined classes of curves. Instead, their natural description may be in terms of completely general parametric curves defined by $$r(t)=\{x(t),y(t)\}\ t_1 \leq t \leq t_2 \qquad (1.1)$$

Where r is a point on the curve in the XY plane with coordinates (x, y) and t is the parameter selected from an interval starting at an initial parameter value, $t_1$, and ending at a final parameter value, $t_2$. The advantage of such description is that it may be much closer to the mathematical model of the device, therefore calculations on it may be more accurate and easier to perform. For example, if the functions describing the curves are known, then intersections between curves or various curve differentials (tangent, normal, curvature) can be calculated exactly. On the other hand, since curves described by arbitrary parametric functions cannot be represented in the design tool or data exchange format directly, a method is required to approximate them by the supported class of curves when needed and while controlling the error. In general, this approximation should only be performed for the purpose of graphical display, storage in the native object database, exporting of manufacturing data etc.

Figure 2:
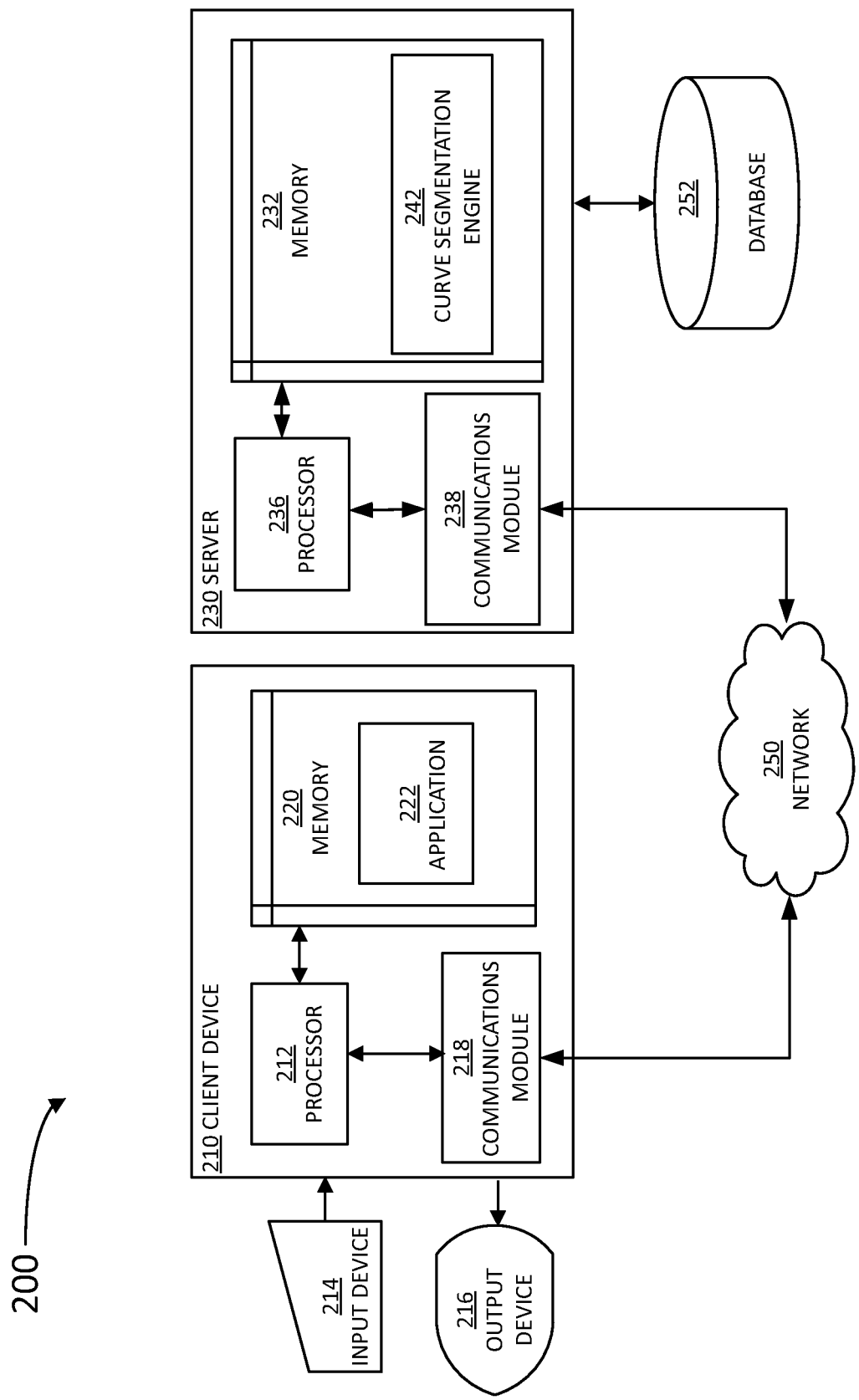
FIG. 2 illustrates an architecture including systems to generate discrete representations of arbitrary parametric curves for IC manufacturing, according to some embodiments.

FIG. 2 illustrates an architecture 200 including systems to generate discrete representations of arbitrary parametric curves for IC manufacturing, according to some embodiments.

A client device 210 includes a processor 212 configured to execute instructions stored in a memory 220. Memory 220 may include an application 222, which includes commands that when executed by processor 212 cause client device 210 to perform methods consistent with the present disclosure. Application 222 may include a runtime software program running on client device 210 to issue commands to server 230 for controlling a curve segmentation engine 242. For example, in some embodiments the user may provide a parametric curve, r(t) to server 230 via application 222, wherein the parametric curve, r(t), is indicative of a feature in an IC circuit (e.g., parametric curve 101 or parallel curve 102). Server 230 may be configured to provide to client device 210 a set of points that are the vertices of a segmented curve representative of the feature in the IC circuit, so that application 222 may provide a layout for a mask fabrication. The segmented curve may be free of intersection points or self-intersection points, so that the feature may be reproduced accurately in the mask. The mask may then be used in the fabrication of the IC circuit, including the desired feature.

Client device 210 may also include a communications module 218 that enables client device 210 to transfer data, provide commands and receive instructions from server 230 through a network 250. Client device 210 may be coupled with an input device 214 (e.g., a mouse, a keyboard, a touch screen display, and the like) and to an output device 216 (e.g., a display, a speaker, and the like). Accordingly, a user may enter commands and queries to client device 210 with input device 214, and receive graphic and other information from client device 210 via output device 216. In some embodiments, application 222 may control input device 214 and output device 216 through a graphic user interface (GUI), enabling a user to have access to server 230.

Server 230 may include a memory 232, a processor 236, and a communications module 238 to transfer data, receive commands and provide instructions from client device 210 through network 250. Memory 232 and processor 236 may be communicatively coupled with a curve segmentation engine 242, as disclosed herein.

Curve segmentation engine 242 may be configured to discretize the parametric curve r(t) by a set of 'n' points corresponding to the parameter values $$\tau_1 = t_1, \tau_n = t_2, \tau_i < \tau_{i+1} \qquad (2.1)$$

such that when the curve between successive discretization points is approximated by linear segments $$s_{(i)}(\tau) = r(\tau_i) + \frac{\tau - \tau_i}{\tau_{i+1} - \tau_i} \cdot (r(\tau_{i+1}) - r(\tau_i)), \quad \tau \in [\tau_i, \tau_{i+1}] \qquad (2.2)$$

the maximum deviation is less than the given discretization tolerance, ε. Given such discretization method, the intersections, including self-intersections, of a set of curves (1) can be found with the precision, λ, as follows:

In some embodiments, the set of 'n' points from curve segmentation engine 242 are stored in database 252. Curve segmentation engine 242 includes scripts and functions configured to handle the parametric functions describing the curves to be given symbolically in form of an expression tree stored in database 252. In such a tree, which can be created by parsing the string representation of the function, each expression node object node represents an expression with the following information.

Some example of expression node objects handled by curve segmentation engine 242 and stored in database 252 may include any one of: NUMBER; PARAMETER; SUM; DIFFERENCE; PRODUCT; QUOTIENT; MINUS; POWER; SQRT; LOG; EXP; SIN; COS; TAN; ARCTAN.

Other expression types may be included, as follows. For expression type number: the numerical value node: number. For expression type power: the integer power node: power. For unary expression types: the first argument node: first, which is a pointer to another expression node object representing the first argument subexpression. For binary expression types: the second argument node: second, which is a pointer to another expression node object representing the second argument subexpression.

Using the above functions, curve segmentation engine 242 is configured to create multiple expression nodes, such as: expression node of type NUMBER (node←NUMBER (value)); expression node of type PARAMETER (node←PARAMETER); expression node of type POWER (node←POWER(power)); expression nodes of unary type (node←MINUS(first), node←LOG(first), node←EXP (first), node←SIN(first), node←COS(first), node←TAN (first), node←ARCTAN(first)); expression node of binary type (node←SUM(first, second), node←DIFFERENCE (first, second), node←PRODUCT(first, second), node←QUOTIENT(first, second), node←POWER(first, second)).

For example, curve segmentation engine 242 may create an expression tree for the function $$\frac{1}{5\sqrt{8\arctan(1)}} e^{-\frac{1}{2}(\frac{t-2}{5})^2} \qquad (2.3)$$

with a string representation "1/(5*sqrt(8*arctan(1)))*exp (—½*((t−2)/5)^2)" can be created by the following code sequenceone←NUMBER(1); two←NUMBER(2); five- ←NUMBER(5); eight←NUMBER(8); t←PARAMETER; n1←DIFFERENCE(t, two); n2←QUOTIENT(n1, five); n3←POWER(n2, 2); n4←QUOTIENT(one, two); n5←MINUS(n4); n6←PRODUCT(n5, n3); n7←EXP(n6); n8←ARCTAN(one); n9←PRODUCT(eight, n8); n10←SQRT(n9); n11←PRODUCT(five, n10); n12←QUOTIENT(one, n11); f←PRODUCT(n12, n7).

In some embodiments, database 252 or curve segmentation engine 242 may store a function including instructions which, when executed by processor 236 or processor 212 will evaluate the expression given by the top-most node e of the expression tree for a parameter value, t. Without limitation, one example of such function may include the following commands:

```
function EVALUATE(e, t)
  if e.type=NUMBER then
    return e:number
  else if e.type=PARAMETER then
    return t
  else if e.type=SUM then
    return EVALUATE(e.first; t)+EVALUATE(e.second; t)
  else if e.type=difference then
    return EVALUATE(e.first; t)−EVALUATE(e.second; t)
  else if e.type=product then
    return EVALUATE(e.first; t)×EVALUATE(e.second; t)
  else if e.type=quotient then
    return EVALUATE(e.first; t)/EVALUATE(e.second; t)
  else if e.type=minus then
    return −EVALUATE(e.first)
  else if e.type=POWER then
    r←1
    v←EVALUATE(e.first)
    for i 1; e.power do
    r←rv
    end for
    return r
  else if e:type=SQRT then
    return sqrt(EVALUATE(e.first))
  else if e.type=LOG then
    return log(EVALUATE(e.first))
  else if e.type=exp then
    return exp(EVALUATE(e.first))
  else if e.type=sin then
    return sin(EVALUATE(e.first))
  else if e.type=cos then
    return cos(EVALUATE(e.first))
  else if e.type=tan then
    return tan(EVALUATE(e.first))
  else if e.type=ARCTAN then
    return arctan(EVALUATE(e.first))
  end if
end function
```

Curve segmentation engine 242 may also include the following function to derive the expression given by the top-most node, e, of the expression tree and return and return a new expression tree representing the derivative expression:

```
function DERIVE(e)
  if e.type=NUMBER then
    return NUMBER(0)
  else if e.type=PARAMETER then
    return NUMBER(1)
  else if e.type=SUM then
    return SUM(DERIVE(e.first), DERIVE(e.second))
  else if e:type=DIFFERENCE then
    return DIFFERENCE(DERIVE(e.first), DERIVE(e.second))
  else if e:type=PRODUCT then
    e1←product(DERIVE(e.first), e.second)
    e2←product(e.first, DERIVE(e.second))
    return SUM(e1, e2)
  else if e:type=QUOTIENT then
    e1←PRODUCT(DERIVE(e.first), e.second)
    e2←PRODUCT(e.first, DERIVE(e.second))
    e3←DIFFERENCE(e1, e2)
    return QUOTIENT(e3, POWER(e.second, 2))
  else if e:type=MINUS then
    return MINUS(DERIVE(e.first))
  else if e:type=POWER then
    e1←POWER(e:first; number(e.power−1))
    e2←PRODUCT(number(e.power); e1)
    return PRODUCT(DERIVE(e.first); e2)
  else if e.type=SQRT then
    e1←QUOTIENT(DERIVE(e.first), SQRT(e.first))
    return QUOTIENT(e1; number(2))
  else if e.type=log then
    return QUOTIENT(DERIVE(e.first); e.first))
  else if e.type=exp then
    return PRODUCT(DERIVE(e.first); exp(e.first))
  else if e.type=sin then
    return PRODUCT(DERIVE(e.first); COS(e.first))
  else if e.type=cos then
    return MINUS(PRODUCT(DERIVE(e.first); SIN(e.first))
  else if e.type=tan then
    return QUOTIENT(DERIVE(e.first); POWER(COS(e.first); 2))
  else if e.type=arctan then
    return QUOTIENT(DERIVE(e.first); SUM(NUMBER(1);
    POWER(e.first; 2)))
  end if
end function
```

Figure 3:
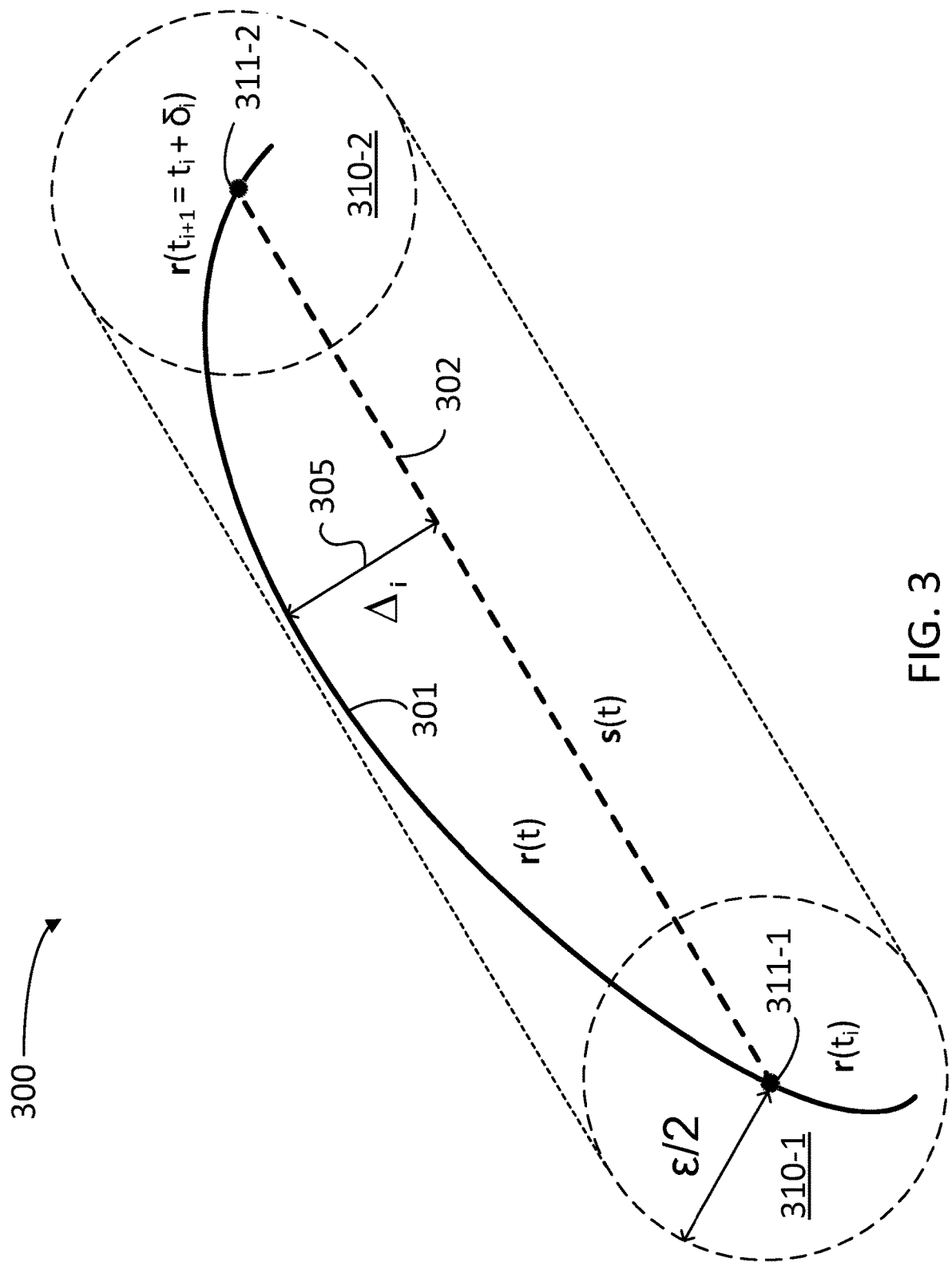
FIG. 3 illustrates a discretization tolerance and a discretization error for a segment between two points of a parametrized curve, according to some embodiments.

FIG. 3 illustrates a discretization tolerance 300, 310-1 and 310-2 (of radius $\varepsilon/2$), and a discretization error 305 ($\Delta_i$) for a segment 302 (s(t)) between two nodes 311-1 and 311-2 of a parametrized curve 301 (r(t)), hereinafter, collectively referred as "nodes 311," according to some embodiments. The parameter difference between node 311-1 and 311-2, $\delta_i$, is chosen such that throughout segment 302, the distance between segment 302 and parametric curve 301 ($\Delta_i$) is less than $\varepsilon/2$.

Eqs. 2.1 and 2.2 are an approximation. It is desirable to control its error, which obviously depends on the choice of discretization points, the size of the discretization step and on the deviation of the curve between the points from the straight line. On one hand, the error should not exceed a certain discretization tolerance, $\varepsilon$, which is set either by the limits of the manufacturing process or by the physics of the particular technology. On the other hand, while increasing the density of discretization points will always reduce the error, it will also increase the amount of data needed to approximate the curve. The optimal choice of discretization points would minimize their number by letting the error always just reach the discretization tolerance, while never exceeding it.

Computing the error and the optimal choice of discretization points in general requires mathematical analysis of the curve function. In some cases this is simple, e.g. for a circle of radius R it is easy to see that in order for the maximum approximation error to be $\varepsilon$, the discretization points on the circle should be spaced by $2\sqrt{(2R-\varepsilon)\cdot\varepsilon}$. For a general curve, however, such analysis may not be as straightforward and sometimes not even possible to perform exactly. Therefore, a more practical approach is not to compute the discretization error exactly, but rather estimate its upper bound with a high degree of confidence. If such upper bound estimate can be calculated as a function of the distance between the discretization points, then the inverse of such function can be used to calculate discretization points such that the error will just reach the discretization tolerance e and thus minimize their number.

In this paper we describe a method to discretize the curve in such a way by using the Taylor series expansion of the curve function. The method finds the discretization of the curve by a combination of prediction, in which the Taylor series expansion is used to calculate the next discretization point, and correction, in which the Taylor series is used to estimate the error and to reduce the discretization step if necessary. The derivatives of the curve functions are computed using and symbolic algebra. In the following sections we first describe the mathematical basis of the method, then the algorithm to implement the method in software and finally some results of the method applied to examples.

The error of approximating the curve r(t) by a line segment si(tau) is defined as the largest distance from any point si(tau) to the nearest point r(t)

$$d(s_i, r) = \max_{\tau_i < \tau < \tau_{i+1}} \min_{t} \|s_i(\tau) - r(t)\| \quad (3.1)$$

Instead of finding the exact value of $d(s_i, r)$ we rather consider its upper bound $\Delta_i \geq d(s_i, r)$ defined by $$\Delta_i = \max_{\tau_i < \tau < \tau_{i+1}} \Delta_i(\tau) \quad (3.2)$$

where $\Delta_i(\tau)$ is the distance between the points on both curves with the same parameter value $$\Delta_i(\tau) = \|s_i(\tau) - r(t)\| \quad (3.3)$$

Denoting the maximum allowed approximation error by _, we require $$\Delta_i < \varepsilon \quad (3.4)$$

If we can find an estimate for $\Delta_i$ as a function of $\tau_i$ and $\tau_{i+1}$, then (5) can be used to calculate the next value $\tau_{i+1}$ following $\tau_i$ such that the approximation error will be less than e. To obtain an estimate for $\Delta_i$, we assume that r(t) is N+1>2 times differentiable on the interval $[t_1; t_2]$ and that we are able to explicitly calculate its first N≥2 derivatives. Then we can expand r(τ) around $\tau_i$ in a Taylor series $$s_i(\tau) = r(\tau_i) + (\tau - \tau_i) \cdot r'(\tau_i) + \sum_{n=2}^{N} \frac{(\tau - \tau_i)^n}{n!} \cdot r^{(n)}(\tau_i) + R_N r(\tau_i; \tau) \quad (3.5)$$

where $R_N f(a; b)$ denotes the N-th order Taylor series remainder for a function f expanded around a and evaluated at b. Using (6) we can rewrite (2) as $$s_i(\tau) = r(\tau_i) + (\tau - \tau_i) \cdot r'(\tau_i) + \quad (3.6)$$

-continued
$$\sum_{n=2}^{N} \frac{(\tau - \tau_i) \cdot (\tau_{i+1} - \tau_i)^{n-1}}{n!} \cdot r^{(n)}(\tau_i) + \frac{\tau - \tau_i}{\tau_{i+1} - \tau_i} \cdot R_N r(\tau_i; \tau)$$

Inserting (6) and (7) in (4) we get.

$$\Delta_i(\tau) = \quad (3.7)$$

$$\left\| (\tau - \tau_i) \cdot (\tau_{i+1} - \tau) \sum_{n=2}^{N} \sum_{m=0}^{n-2} \frac{(\tau - \tau_i)^{n-2-m} \cdot (\tau_{i+1} - \tau_i)^m}{n!} \cdot r^{(n)}(\tau_i) + \frac{\tau - \tau_i}{\tau_{i+1} - \tau_i} \cdot R_N r(\tau_i; \tau) \right\|$$

In some embodiments, $\Delta_i(\tau_i)=0$ and $\Delta_i(\tau_{i+1})=0$ since the discretization points themselves lie exactly on the curve. For $\tau_i < \tau < \tau_{i+1}$ between the discretization points we substitute the two remainder terms in (8) by their Lagrange forms $$R_N r(\tau_i; \tau) = \frac{(\tau - \tau_i)^{N+1}}{(N+1)!} r^{(N+1)}(\xi(\tau_i, \tau)), \quad \tau_i \leq \xi(\tau_i, \tau) \leq \tau \quad (3.8)$$

which allows us to rewrite the upper bound for the maximum error as $$\Delta_i < \epsilon_i + \rho_i$$

where the two contributions are $$\epsilon_i = \frac{1}{4} \sum_{n=2}^{N} \frac{(n-1)(\tau_{i+1} - \tau_i)^n}{n!} \|r^{(n)}(\tau_i)\| \quad (3.9)$$

$$\rho_i = \frac{2(\tau_{i+1} - \tau_i)^{N+1}}{(N+1)!} \max_{\tau_i \leq \tau \leq \tau_{i+1}} \|r^{(N+1)}(\tau)\| \quad (3.10)$$

The first contribution $\epsilon_i$ is due to the deviation of the approximating line segment from the N-th order Taylor series representation of the curve. In the lowest order this deviation is proportional to the second derivative of the curve function, which is related to its curvature. The second contribution $\rho_i$ is due to the deviation of the N-th order Taylor series representation of the curve from the actual curve. This deviation is related to the maximum value of the (N+1)-th derivative of the curve function on the interval $[L_i; L_{i+1}]$.

Figure 4:
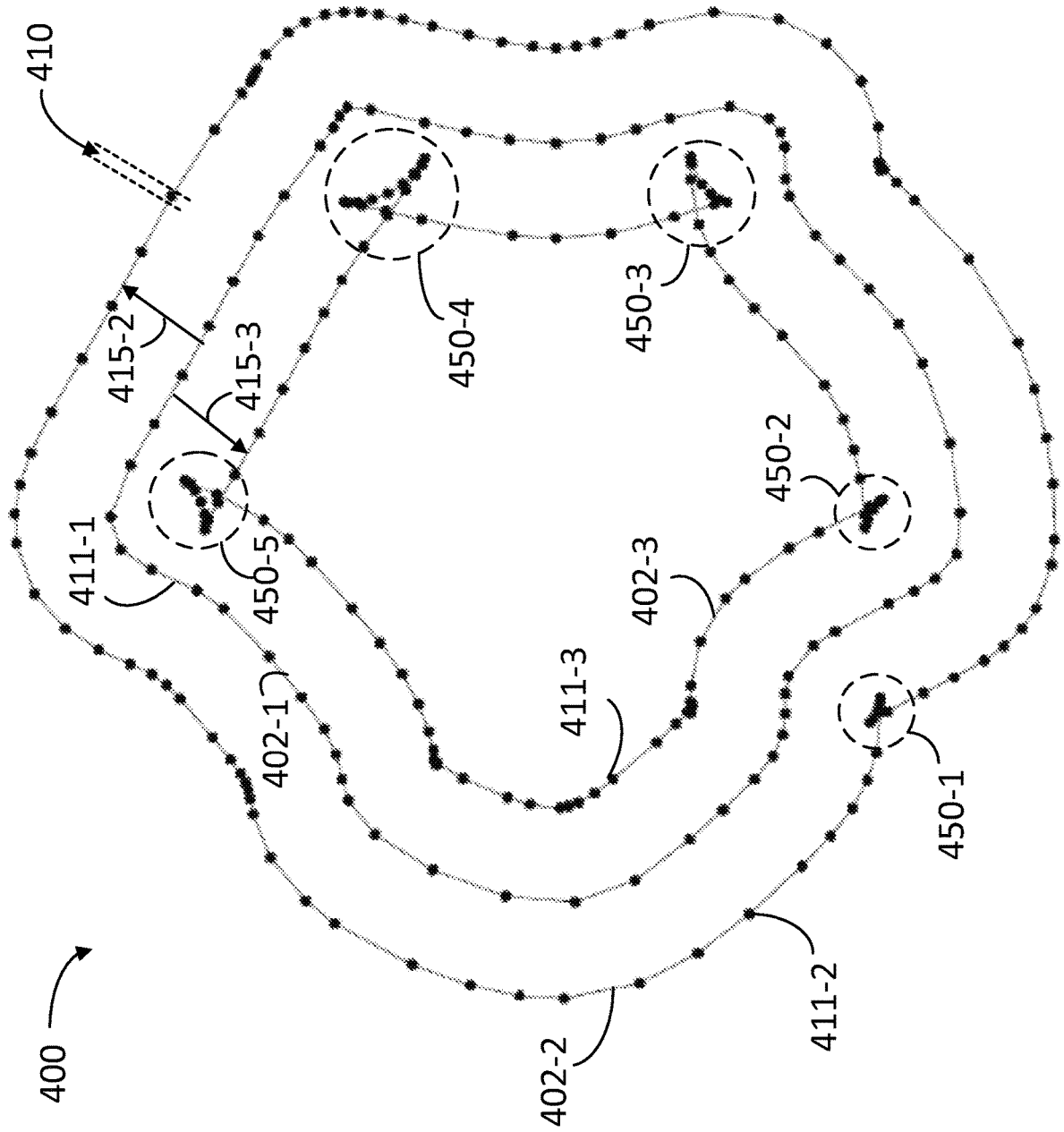
FIG. 4 illustrates a set of discretized parametric curves using a discretization tolerance, according to some embodiments.

FIG. 4 illustrates a discretized segmentation 400 of a parametrized curve, including straight segments 402-1, 402-2, and 402-3 (hereinafter, collectively referred to as "segments 402") using a discretization tolerance 410, according to some embodiments. In some embodiments, segments 402-2 and 402-3 are separately obtained from a "parallel offset" 415-2 and 415-3, respectively, from the parametric curve approximated by discretized segmentation 402-1 (hereinafter, collectively referred to as "offsets 415").

Segments 402-1, 402-2, and 402-3 include nodes 411-1, 411-2 and 411-3, respectively (hereinafter, collectively referred to as "nodes 411"). Nodes 411 have been selected such that the distance between segments 402 and the true parametric curves is less than discretization tolerance 410, which is the radius of the circles indicating nodes 411.

In some embodiment, the discretized segmentation of a parallel offset curve may have self-intersecting points forming loop artifacts, such as illustrated with loops 450-1, 450-2, 450-3, 450-4, and 450-5 (hereinafter, collectively referred to as "loops 450") for discretized segmentation 402-3.

Figure 5A:
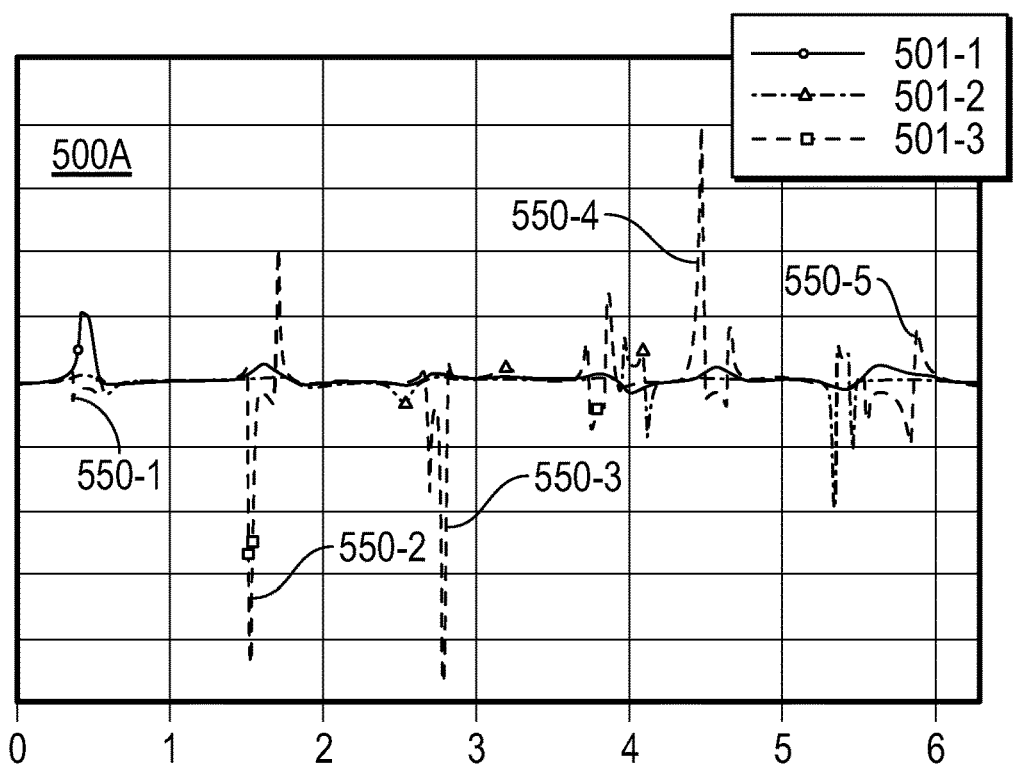
FIGS. 5A-B illustrate a curvature chart and a discretization step chart for the parametric curves in FIG. 4, according to some embodiments.
Figure 5B:
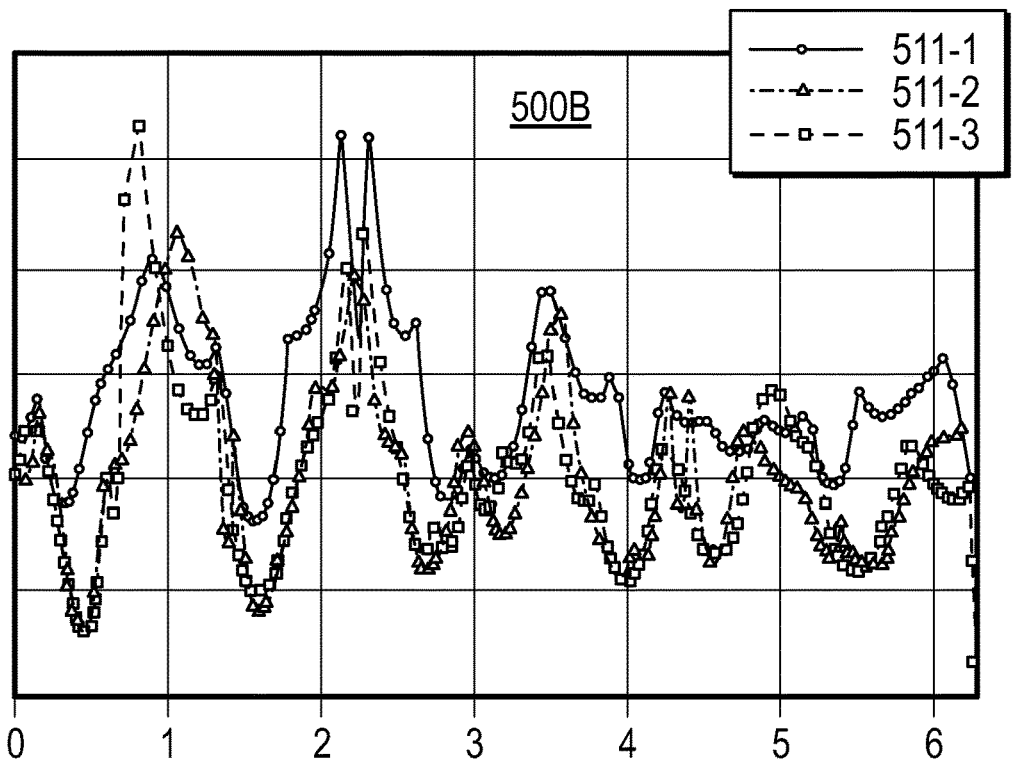

FIGS. 5A-B illustrate a curvature chart 500A and a discretization step chart 500B for segments 402, according to some embodiments. Curvature chart 500A and discretization step chart 500B will be collectively referred to hereinafter as charts 500. The abscissae in charts 500 (horizontal, or X-axis) include the value of parameter t over the entire cycle of the parametric curves for segments 402.

The ordinates (vertical, or Y-axis) in curvature chart 500A include a curvature if the parametric curves used in the segments 402. Accordingly, curve 501-1 indicates the curvature associated with discretized segmentation 402-1. Curve 501-2 indicates the curvature associated with discretized segmentation 402-2. And curve 501-3 indicates the curvature associated with discretized segmentation 402-3. The features 550-1, 550-2, 550-3, 550-4 and 550-5 (hereinafter, collectively referred to as "features 550") in curve 501-3 are associated with and indicative of loops 450.

The ordinates (vertical, or Y-axis) in discretization step chart 500B include the value of the discretization step, $\delta_i$, for each of the steps completing the cycle in segments 402. Accordingly, curve 511-1 indicates the discretization steps for discretized segmentation 402-1; curve 511-2 indicates the discretization steps for discretized segmentation 402-2; curve 511-3 indicates the discretization steps for discretized segmentation 402-3.

Figure 6A:
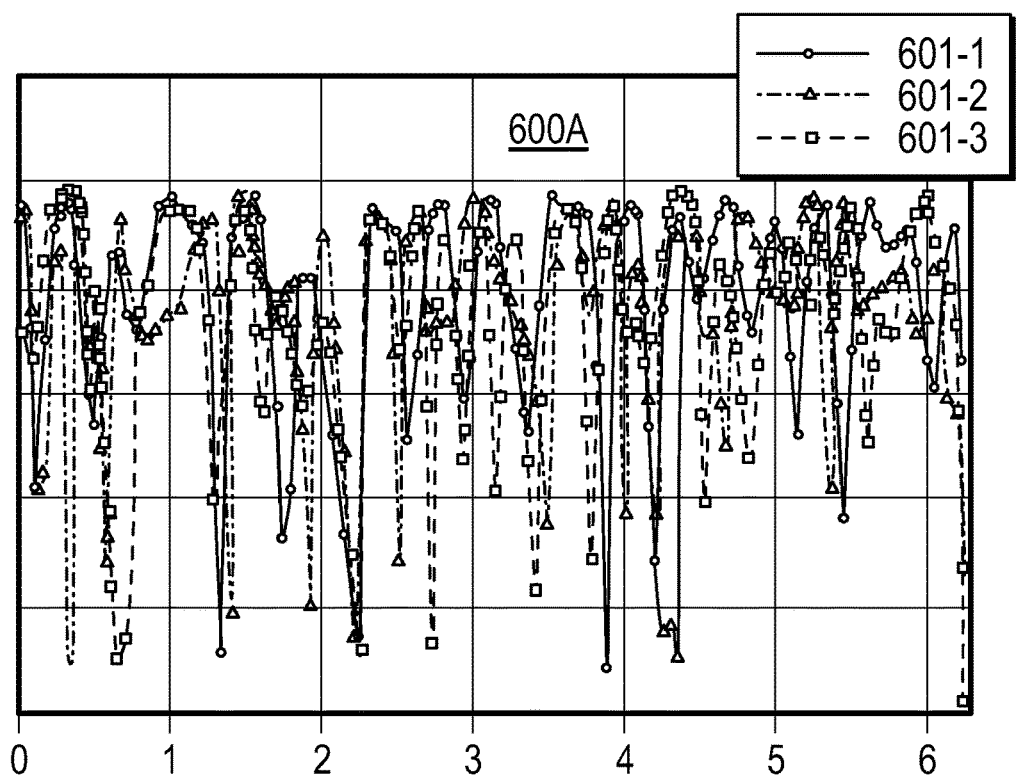
FIGS. 6A-B illustrate discretization error charts between the parametric curves in FIG. 4 and the corresponding discretized linear segments, according to some embodiments.
Figure 6B:
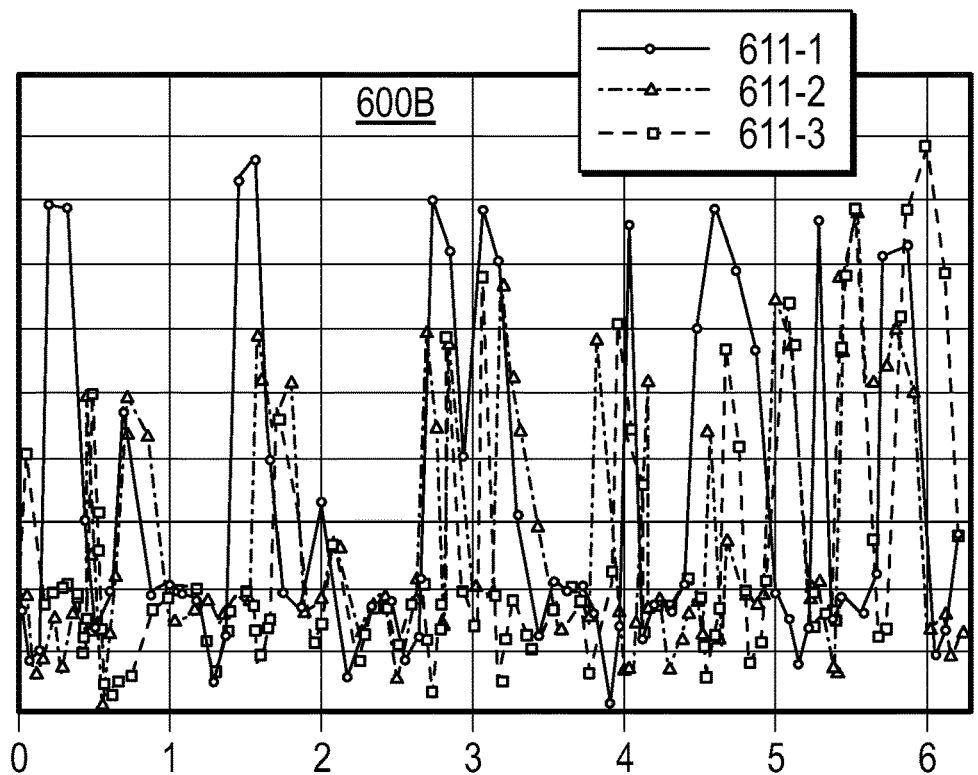

FIGS. 6A-B illustrate discretization error charts 600A-B between segments 402 and the corresponding parametric curves, according to some embodiments. Error charts 600A and 600B will be collectively referred to hereinafter as error charts 600. The abscissae in error charts 600 (horizontal, or X-axis) include the value of parameter t over the entire cycle of the parametric curves for segments 402. The ordinates (vertical, or Y-axis) in error charts 600 include the value of the error, $\Delta_i$, between the linear segment and the corresponding parametric curve.

Error chart 600A includes curves 601-1, 601-2, and 601-3 for segments 402-1, 402-2, and 402-3, respectively (hereinafter, collectively referred to as "error curves 601"). Error curves 601 are obtained for segments 402 using a discretization tolerance 310 of ε=0.01. Error chart 600B includes curves 611-1, 611-2, and 611-3 for segments 402-1, 402-2, and 402-3, respectively (hereinafter, collectively referred to as "error curves 611"). Error curves 611 are obtained for segments 402 using a discretization tolerance 310 of ε=0.1.

Figure 7A:
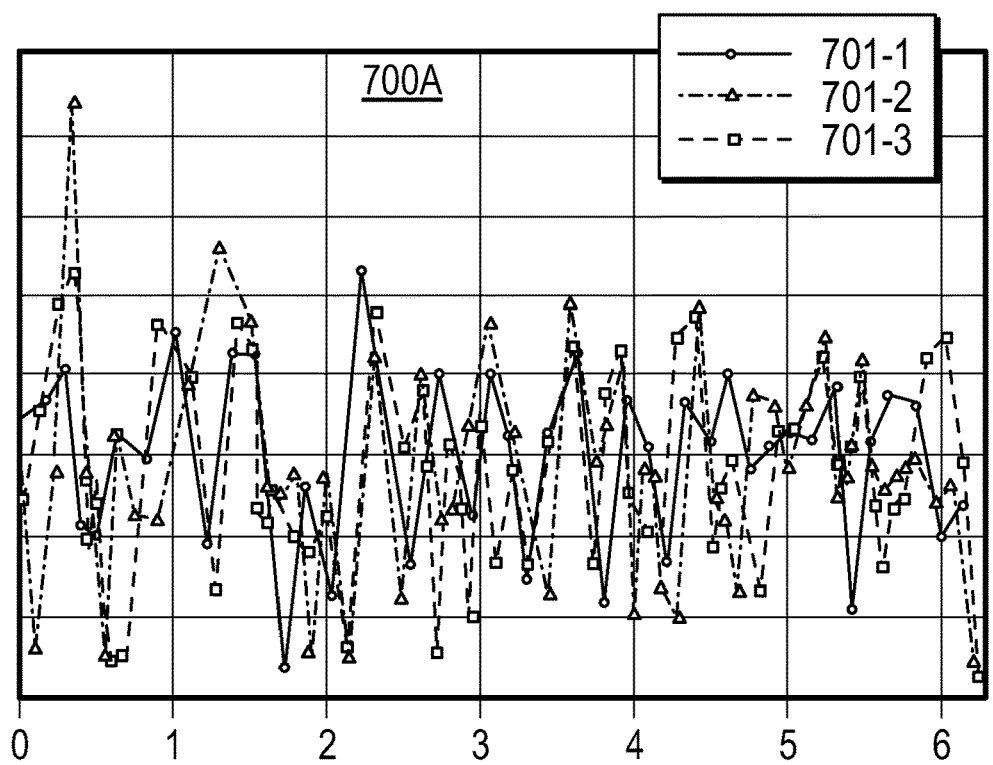
FIGS. 7A-B illustrate discretization error charts between the parametric curves in FIG. 4 when no corrective step is applied, according to some embodiments.
Figure 7B:
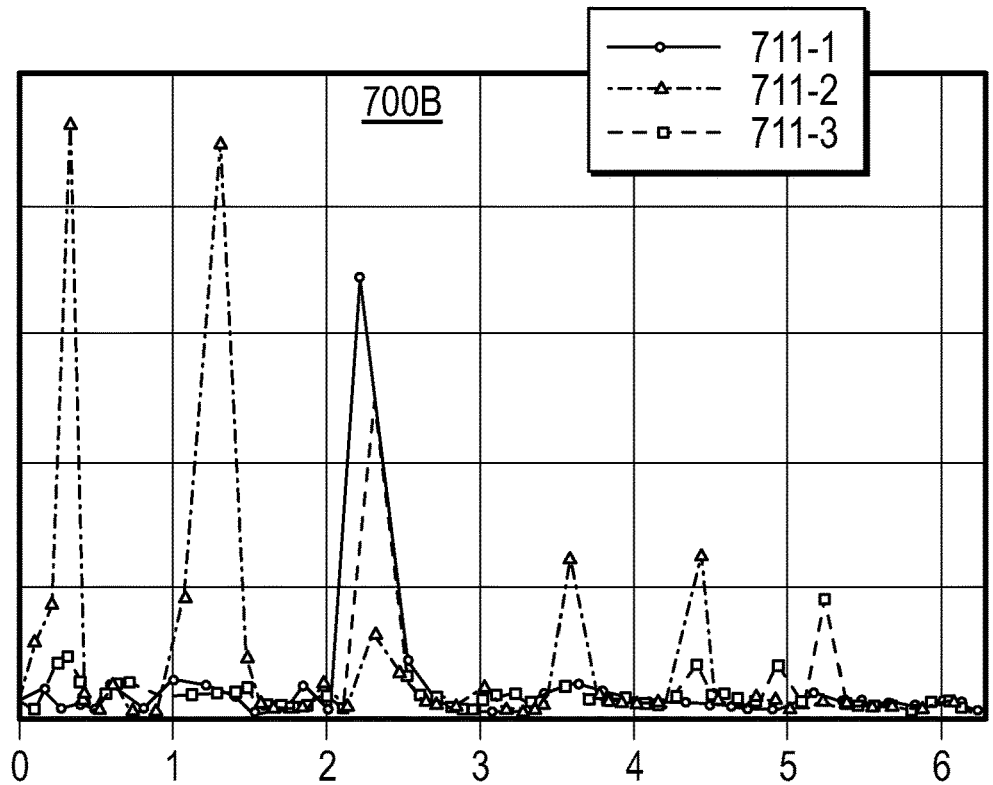

FIGS. 7A-B illustrate discretization error charts 700A-B between parametrized segmentations 402 when no corrective step is applied, according to some embodiments. Error charts 700A and 700B will be collectively referred to hereinafter as error charts 700. The abscissae in error charts 700 (horizontal, or X-axis) include the value of parameter t over the entire cycle of the parametric curves for segments 402. The ordinates (vertical, or Y-axis) in error chart 700A include the value of the error, $\Delta_i$, between the linear segment and the corresponding parametric curve. The ordinate in error chart 700B includes the portion of error $\Delta_i$ associated with the second contribution, $\rho_i$ (cf. Eq. 3.10).

Error chart 700A includes curves 701-1, 701-2, and 701-3 for segments 402-1, 402-2, and 402-3, respectively (hereinafter, collectively referred to as "error curves 701"). Error chart 700B includes curves 711-1, 711-2, and 711-3 for segments 402-1, 402-2, and 402-3, respectively (hereinafter, collectively referred to as "error curves 711"). Error curves 701 and 711 are obtained for segments 402 using a discretization tolerance 310 of ε=0.1.

Figure 8:
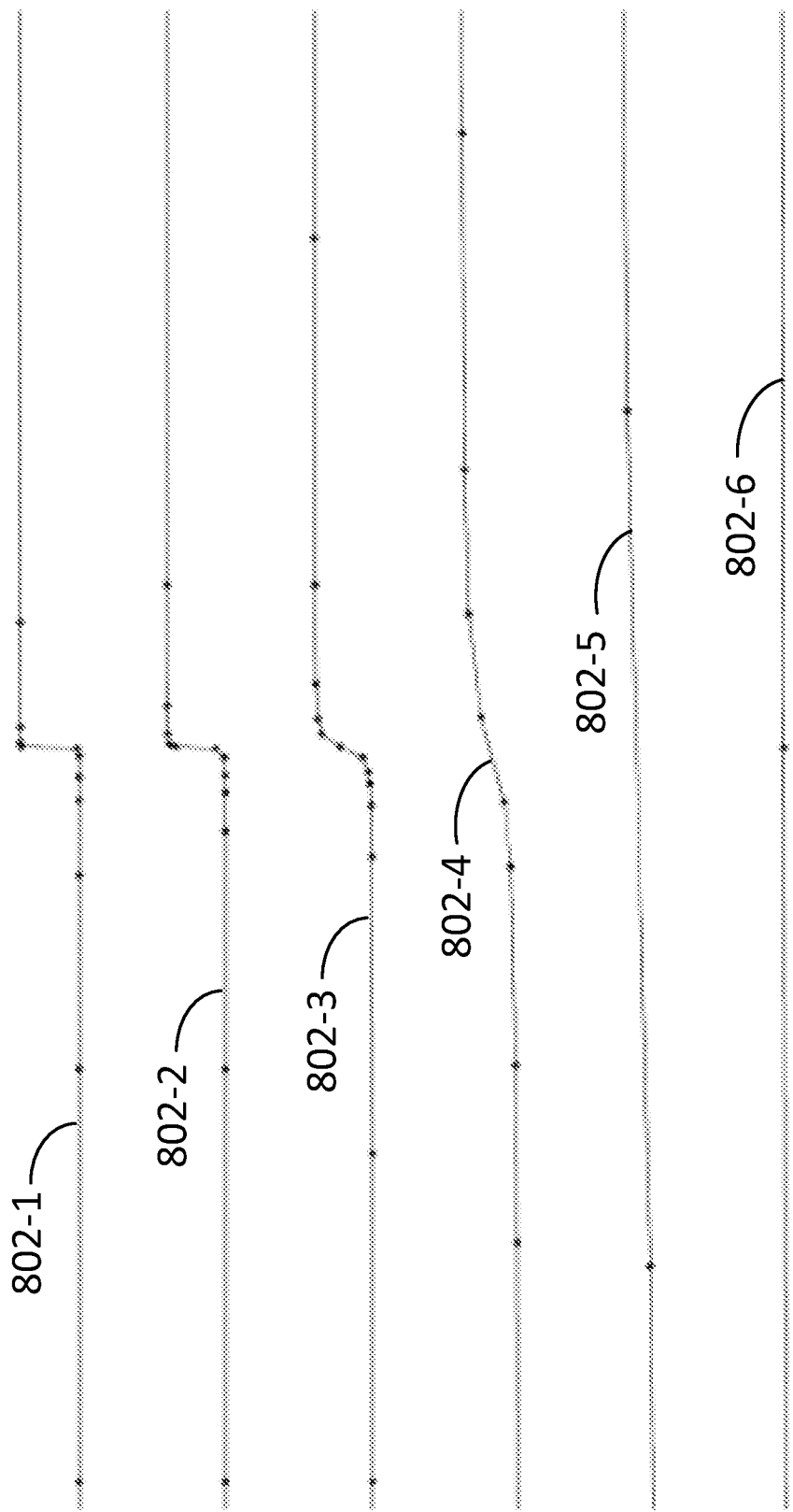
FIG. 8 illustrates a set of discretized parametric curves for a step function using different widths, according to some embodiments.

FIG. 8 illustrates a set of segments 802-1, 802-2, 802-3, 802-4, 802-5, and 802-6 (collectively referred to, hereinafter, as "segments 802") for a step function using different widths, w, according to some embodiments. The parametric curve for segments 802 is $$\begin{aligned} x(t) &= t & (8.1)\\ y(t) &= 0.01/\pi \arctan(t/w)\\ t &\in [-1, 1]\\ w &= 10^{-1}, 10^{-2}, 10^{-3}, 10^{-4}, 10^{-5} \end{aligned}$$

Wherein for curve 802-1, w=1; for curve 802-2, w=0.1; for curve 802-3, w=0.01; for curve 802-4, w=0.001; for curve 802-5, w=0.0001; and for curve 802-6, w=0.00001.

FIGS. 9A-D illustrates a discretized segmentation of a Cornu spiral, according to some embodiments.

$$\begin{aligned} x(t) &= C(t) = \int_0^t \cos\left(\frac{\pi u^2}{2}\right) du & (9.1)\\ y(t) &= S(t) = \int_0^t \sin\left(\frac{\pi u^2}{2}\right) du\\ t &\in [-3\pi/2, 3\pi/2] \end{aligned}$$

FIGS. 9A-C illustrate the portion of Eqs. 9.1 in the region t∈[−0.5, 0.5]. FIG. 9A illustrates nodes 911A corresponding to a Taylor approximation of the parametric curve in Eqs. 9.1 for N=3. FIG. 9B illustrates nodes 911B corresponding to a Taylor approximation for N=4. And FIG. 9C illustrates nodes 911C corresponding to a Taylor approximation for N=5.

FIG. 9D illustrates the entire Cornu spiral in the region t∈[−3 π/2, 3 π/2] for a Taylor approximation of N=5.

FIG. 10 illustrates a query table for a user of an application 1022 to generate discretized segmented representations of arbitrary parametric curves (e.g., application 222), according to some embodiments.

Figure 11:
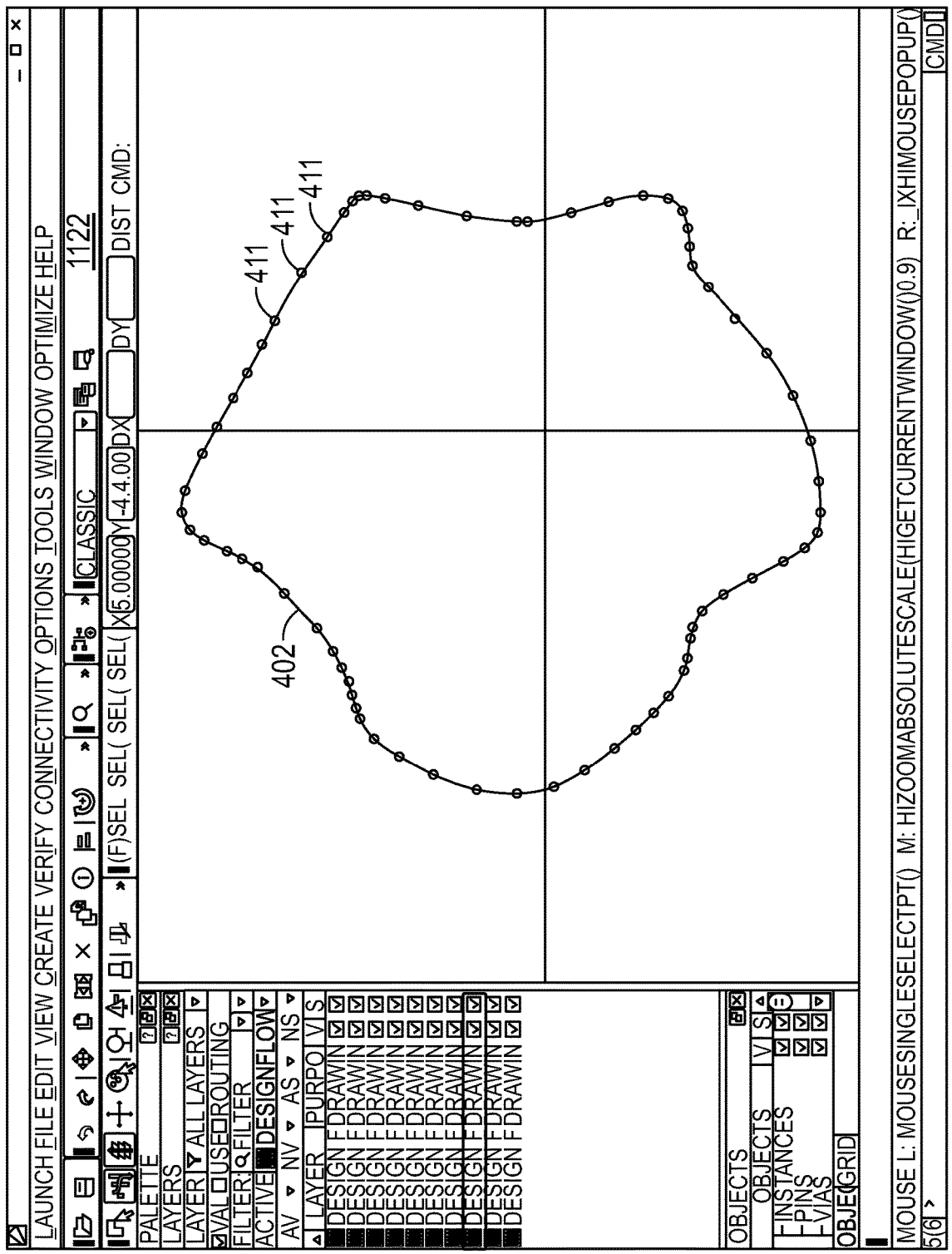
FIG. 11 illustrates a screen shot of the application in FIG. 10, according to some embodiments.

FIG. 11 illustrates a screen shot 1122 of application 1022, according to some embodiments. Screen shot 1122 includes discretized segmentation 402 of a parametric curve as shown above, including nodes 411.

Figure 12:
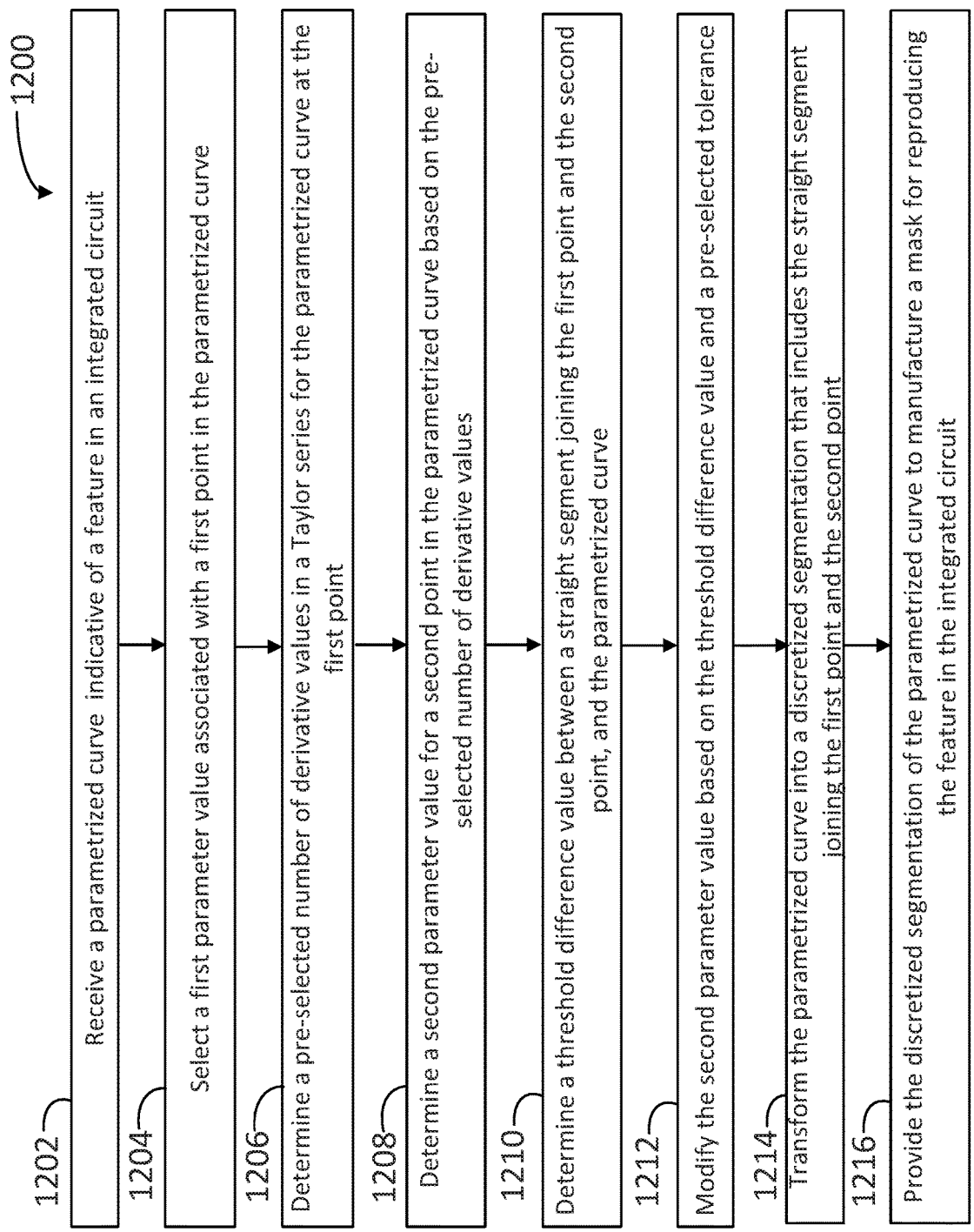
FIG. 12 is a flow chart illustrating steps in a method for providing a discrete segmentation of an arbitrary parametric curve, according to some embodiments.

FIG. 12 is a flow chart illustrating steps in a method 1200 for providing a discrete segmentation of an arbitrary parametric curve, according to some embodiments. At least some of the steps in method 1200 may be performed by a computer having a processor executing commands stored in a memory of the computer (e.g., processors 212 and 236, memories 220 and 232). Further, steps as disclosed in method 1200 may include retrieving, editing, and/or storing files in a database that is part of, or is communicably coupled to, the computer (e.g., database 252). Methods consistent with the present disclosure may include at least some, but not all, of the steps illustrated in method 1200, performed in a different sequence. Furthermore, methods consistent with the present disclosure may include at least two or more steps as in method 1200, performed overlapping in time, or almost simultaneously.

In some embodiments, at least one or more of the steps in method 1200 may be performed in a cloud computing environment, wherein a computer may include servers, such as a master server and a slave server. Accordingly, at least some of the steps illustrated in method 1200 may be performed in parallel in different processors, following separate computational threads. For example, each of the separate computational threads may be performed by at least one of the slave servers in each of multiple applications and processors dedicated to the specific computational thread.

Processors and computer devices performing method 1200 may be able to calculate the values of curve functions and their first N derivatives at any point on the interval [$t_1$; $t_2$]. The curve functions and their derivatives can be either precompiled, or represented by symbolic expressions. Some embodiments use a symbolic expression representation of curve functions because that allows us to specify them at runtime and obtain their derivatives automatically by symbolic derivation. In the following we assume that curve functions are represented by symbolic expressions objects and that functions are available to obtain the numerical value of the symbolic expression 'e' for parameter value t.

When x(t) and y(t) are analytic functions (cf. Eqs. 1.1, 8.1 and 9.1), they can be expanded at every point into a Taylor series. The basic assumption of the proposed method is that the local behavior of the curve function is well described already by the first N terms of the Taylor series. Then a set of discretization points for the curve r(t) can be found iteratively as follows:

Step 1202 includes receiving a parametrized curve indicative of a feature in an integrated circuit.

Step 1204 includes selecting a first parameter value associated with a first point in the parametrized curve.

Step 1206 includes determining a pre-selected number of derivative values in a Taylor series for the parametrized curve at the first point.

Starting with $\tau_1 = t_1$, we approximate r(t) around the current discretization point $r(\tau_i)$ by the first N terms of the Taylor series and choose the next discretization point $r(\tau_{i+1})$ such that the estimated maximum deviation of the line (2) from the curve (1) is equal to $\varepsilon/2$.

Step 1208 includes determining a second parameter value for a second point in the parametrized curve based on the pre-selected number of derivative values. In some embodiments, step 1208 includes determining an increment added to the first parameter value, the increment associated with the pre-selected number of derivative values.

Step 1210 includes determining a threshold difference value between a straight segment joining the first point and the second point, and the parametrized curve.

Since the first N terms of the Taylor series are only an approximation, we estimate their maximum deviation $\rho$ from the actual curve function by comparing the value of the Taylor series expanded around $\tau_i$ and evaluated at $\tau_{i+1}$ to the actual values of the curve function and its first N derivatives at $\tau_{i+1}$. The estimate for $\rho$ is improved by also comparing the value of the actual curve function and its first N derivatives at $\tau_i$ to the value of the Taylor series expanded around $\tau_{i+1}$ and evaluated at $\tau_i$.

Step 1212 includes modifying the second parameter value based on the threshold difference value and a pre-selected tolerance. In some embodiments, step 1212 includes reducing an increment between the second parameter value and the first parameter value, when the threshold error value is larger than the pre-selected tolerance. In some embodiments, step 1212 includes enlarging an increment added to the first parameter value when the threshold error value is smaller than the pre-selected tolerance. In some embodiments, step 1212 includes reducing a difference between the second parameter value and the first parameter value based on a deviation between the Taylor series for the parametrized curve and the parametrized curve. In some embodiments, step 1212 includes forming a partition of a parameter interval, the partition comprising the first parameter value and the second parameter value, and separating the second parameter value from the first parameter value and ensuring that the threshold error value is smaller than the pre-selected tolerance. When the resulting p is less than $\varepsilon/2$, so that the estimated total error is less than $\varepsilon$, the next discretization point becomes the current discretization point and the process is iteratively repeated until the last point on the curve is reached when $\tau_{i+1} \geq t_2$. Otherwise, the next discretization is chosen closer to the current discretization point and new $\rho$ is calculated until it is below $\varepsilon/2$.

Given that the first N+1 derivatives of r(t) on the interval [$t_1$; $t_2$] are finite and assuming that not all derivatives $r^{(n)}(\tau_i)$, $n \leq N$ are vanishing, by choosing a sufficiently small $\tau_{i+1} - \tau_i$ both contributions (11) and (12) can also be made arbitrarily small. In particular, it is possible to find $\delta$ such that for $$\tau_{i+1} < \tau_i + \delta \tag{12.1}$$

The following conditions will hold $$\varepsilon_i = \varepsilon/2$$

$$\rho_i < \varepsilon/2 \tag{12.2}$$

And thus the total error will be below the maximum allowed value $$\Delta_i = \varepsilon_i + \rho_i < \varepsilon \tag{12.3}$$

The value $\delta$ for which the condition (14) is satisfied can be explicitly found as the solution of the N-th order equation $$\sum_{n=2}^{N} \frac{n-1}{n!} \|r^{(n)}(\tau_i)\| \delta^n - 2\varepsilon = 0 \tag{12.4}$$

Here we assume that N has been chosen large enough so that at least one of the derivatives doesn't vanish $$\|r^{(m)}(\tau_i)\| > 0, \, 2 \leq m \leq N \tag{12.5}$$

Noting that the polynomial on the left side of Eq. 12.4 is a monotonically increasing function of $\delta$ and rewriting Eq. 12.4 as $$\delta^m = 2\varepsilon \left( \sum_{n=2}^{N} \frac{n-1}{n!} \|r^{(n)}(\tau_i)\| \delta^{n-m} \right)^{-1} \leq \frac{m!}{m-1} \frac{2\varepsilon}{\|r^{(m)}(\tau_i)\|} \tag{12.6}$$

It can be seen that the solution $\delta$ may be found in the interval $$0 < \delta \leq \left( \frac{m!}{m-1} \frac{2\varepsilon}{\|r^{(m)}(\tau_i)\|} \right)^{\frac{1}{m}} \tag{12.7}$$

And can be found numerically, for example by bisection. Accordingly, in some embodiments the above interval is divided in two portions (not necessarily equal), and a first value for $\delta$ is evaluated at the division between the two portions. Because the error is a monotonic function of $\delta$, the next solution is found in the interval to the left or to the right of the initial δ. This process is iterated until the selected δ satisfies Eq. 12.3.

In contrast to the condition for $\varepsilon_i$ (cf. Eq. 12.2), the value of δ for which the condition for $\rho_i$(cf. Eq. 12.2) is satisfied cannot be explicitly calculated. We can however estimate the error $\rho_i(\delta)$ for a given value of δ by expanding $r(\tau)$ and its first N derivatives $r^{(m)}(\tau)$, m≤N in the Taylor series around $\tau_i$ $$r^{(m)}(\tau_i + \delta) = \sum_{n=0}^{N-m} \frac{\delta^n}{n!} r^{(m+n)}(\tau_i) + \frac{\delta^{N-m+1}}{(N-m+1)!} r^{(N+1)}(\xi(\tau_i, \tau_i + \delta)) \quad (12.8)$$

where by defining $r^{(0)}(\tau)=r(\tau)$ we also allow for the case m=0. Since the values $r^{(n)}(\tau_i+\delta)$, 0≤n≤N can be explicitly calculated, equation (21) can be used to obtain N+1 representative values $r^{(N+1)}m;+$ for $r^{(N+1)}(\tau)$ evaluated at the points $\xi(\tau_i; \tau_i+\delta)$ located somewhere on the interval [$\tau_i$, $\tau_i+\delta$]

$$r_{im,+}^{(N+1)} = \frac{(N-m+1)!}{\delta^{N-m+1}} \left( r^{(m)}(\tau_i + \delta) - \sum_{n=0}^{N-m} \frac{\delta^n}{n!} r^{(m+n)}(\tau_i) \right), 0 \le m \le N \quad (12.9)$$

Analogously we can use the calculated values $r^{(n)}(\tau_i+\delta)$, 0≤n≤N to express $r^{(m)}(\tau_i)$, m≤N by the Taylor series expanded around $\tau_i+\delta$ $$r^{(m)}(\tau_i) = \quad (12.10)$$
$$\sum_{n=0}^{N-m} \frac{(-\delta)^n}{n!} r^{(m+n)}(\tau_i + \delta) + \frac{(-\delta)^{N-m+1}}{(N-m+1)!} r^{(N+1)}(\xi(\tau_i + \delta, \tau_i))$$

Since the values of $r^{(m)}(\tau_i)$ are known, we can use equations (23) to obtain another set of representative values $r^{(N+1)}{}_{m-}$ for $r^{(N+1)}(\tau)$ evaluated at the points $\xi(\tau_i+\delta; \tau_i)$ located somewhere on the interval [$\tau_i; \tau_i+\delta$]

$$r_{im,-}^{(N+1)} = \frac{(N-m+1)!}{(-\delta)^{N-m+1}} \left( r^{(m)}(\tau_i) - \sum_{n=0}^{N-m} \frac{(-\delta)^n}{n!} r^{(m+n)}(\tau_i + \delta) \right), \quad (12.11)$$
$$0 \le m \le N$$

Using (22) and (24) we can estimate the maximum and the minimum of the (N+1)-th derivative of the curve function as $$r_{i,max}^{(N+1)} = \max_{0 \le m \le N} \max_{s=\pm} \|r_{im,s}^{(N+1)}\| \quad (12.12)$$
$$r_{i,min}^{(N+1)} = \min_{0 \le m \le N} \min_{s=\pm} \|r_{im,s}^{(N+1)}\|$$

Let us define the variance $\_i$ of the (N+1)-th derivative of the curve function $$\alpha_i = \max_{\tau_i \le \tau \le \tau_i+\delta} \|r^{(N+1)}(\tau)\| \Big/ \min_{\tau_i \le \tau \le \tau_i+\delta} \|r^{(N+1)}(\tau)\| \quad (12.13)$$

Using (27), we can estimate the maximum of the (N+1)-th derivative of the curve function in terms of the representative value (25).

$$\max_{\tau_i \le \tau \le \tau_i+\delta} \|r^{(N+1)}(\tau)\| < \alpha_i r_{i,max}^{(N+1)} \quad (12.14)$$

We now make an assumption that the variance (27) and the ratio of the maximum and the minimum values of the N+1 representative values (25) and (26) are correlated such that $$\alpha_i = \frac{1}{\beta} \frac{r_{i,max}^{(N+1)}}{r_{i,min}^{(N+1)}} \quad (12.15)$$

Where β≤1 is the correlation factor. Then $\rho_i(\delta)$ can be estimated as $$\rho_i(\delta) = \frac{2\delta^{N+1}}{\beta(N+1)} \frac{(r_{i,max}^{(N+1)})^2}{r_{i,min}^{(N+1)}} \quad (12.16)$$

The estimate (30) can be now used to find ρ for which the condition (15) is satisfied. For this purpose, we start an iteration with the initial value $\rho^0$ equal to the solution of the equation (17). At every step of the iteration, we use the current value $\_k$ to calculate the corresponding error $\rho_i(\delta^k)$ using Eq. 12.16. If $$\rho_i(\delta^k) < \varepsilon/2 \quad (12.17)$$

then $\delta = \delta^k$ and the iteration is stopped. Otherwise, the discretization step is decreased.

$$\delta^{k+1} = \delta^k/2 \quad (12.18)$$

Until the condition in Eq. 12.17 is satisfied.

Step 1214 comprises transforming the parametrized curve into a discretized segmentation that includes the straight segment joining the first point and the second point. In some embodiments, step 1214 includes adding the straight segment to multiple other straight segments in the discretized segmentation of the parametrized curve. In some embodiments, step 1214 includes modifying a register in the memory of the computer by replacing the equations in the parametrized curve (e.g., Eqs. 1.1, 8.1 and 9.1) by multiple numerical entries indicative of the coordinates of the first point and the second point for every straight segment in the discretized segmentation (e.g., nodes 411 and segments 402, cf. FIGS. 4 and 11).

Step 1216 includes providing the discretized segmentation of the parametrized curve to manufacture a mask for reproducing the feature in the integrated circuit. In some embodiments, step 1216 includes forming a second discretized segmentation of a second parametrized curve, wherein the second parametrized curve is a parallel translation of the parametrized curve. In some embodiments, step 1216 includes verifying that no artifacts are present in the discretized segmentation of the parametrized curve, wherein the artifacts comprise a cusp or an intersection. In some embodiments, step 1216 includes identifying an artifact in the discretized segmentation of the parametrized curve and removing a parameter value within the artifact. In some embodiments, step 1216 includes providing a sequence of multiple point coordinates to a mask manufacturer, wherein the sequence of multiple point coordinates define the discretized segmentation of the parametrized curve with straight segments joining the sequence of multiple point coordinates.

Figure 13:
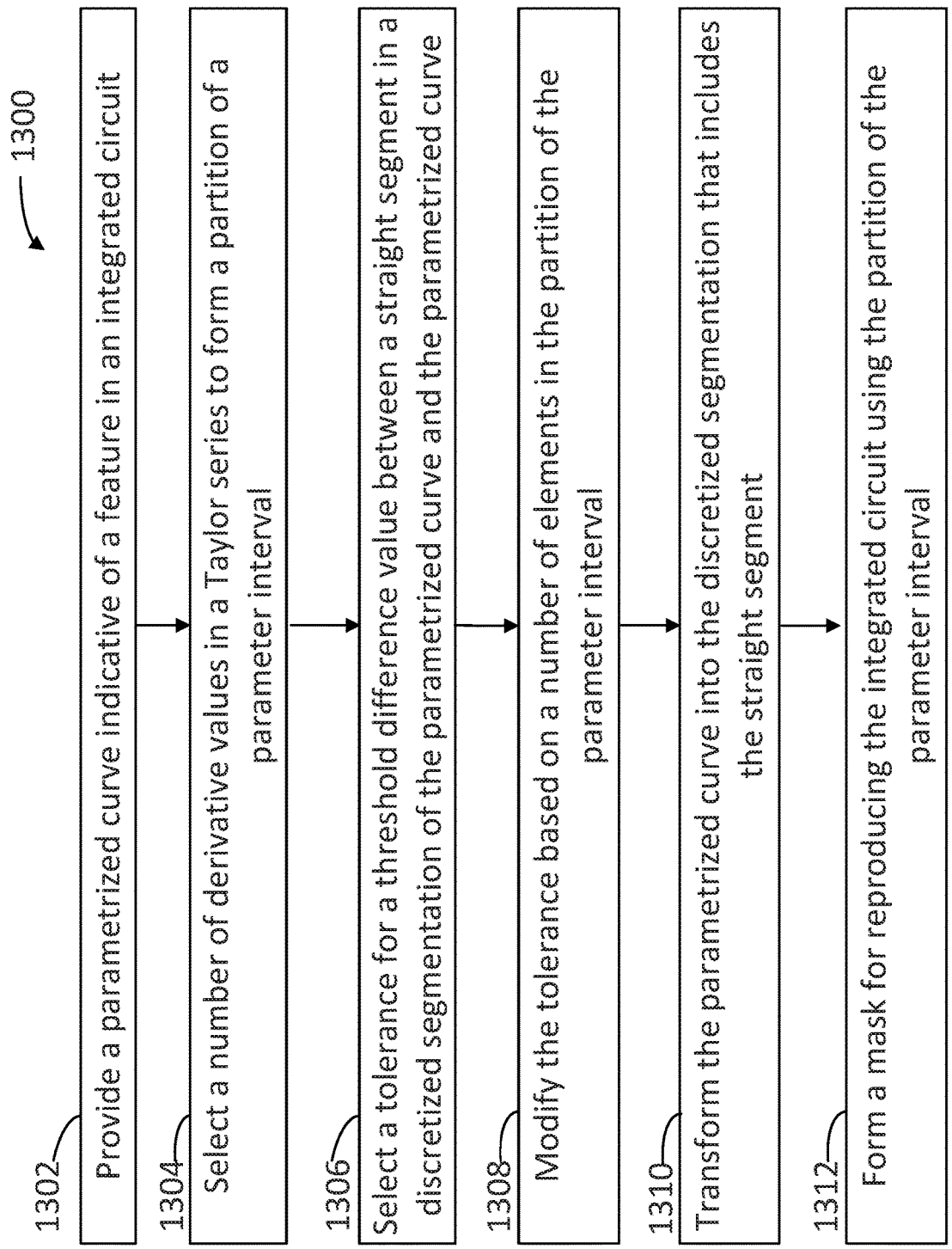
FIG. 13 is a flow chart illustrating steps in a method for using an application that generates a discrete segmentation of an arbitrary parametric curve, according to some embodiments.

FIG. 13 is a flow chart illustrating steps in a method 1300 for using an application that generates a discrete segmentation of an arbitrary parametric curve, according to some embodiments. At least some of the steps in method 1300 may be performed by a computer having a processor executing commands stored in a memory of the computer (e.g., processors 212 and 236, memories 220 and 232). Further, steps as disclosed in method 1300 may include retrieving, editing, and/or storing files in a database that is part of, or is communicably coupled to, the computer (e.g., database 252). Methods consistent with the present disclosure may include at least some, but not all, of the steps illustrated in method 1300, performed in a different sequence. Furthermore, methods consistent with the present disclosure may include at least two or more steps as in method 1300, performed overlapping in time, or almost simultaneously.

In some embodiments, at least one or more of the steps in method 1300 may be performed in a cloud computing environment, wherein a computer may include servers, such as a master server and a slave server. Accordingly, at least some of the steps illustrated in method 1300 may be performed in parallel in different processors, following separate computational threads. For example, each of the separate computational threads may be performed by at least one of the slave servers in each of multiple applications and processors dedicated to the specific computational thread.

Step 1302 includes providing a parametrized curve indicative of a feature in an integrated circuit.

Step 1304 includes selecting a number of derivative values in a Taylor series to form a partition of a parameter interval.

Step 1306 includes selecting a tolerance for a threshold difference value between a straight segment in a discretized segmentation of the parametrized curve and the parametrized curve.

Step 1308 includes modifying the tolerance based on a number of elements in the partition of the parameter interval. In some embodiments, step 1308 includes performing the following function will compute an array of parameter values $t_i$ corresponding to the discretization points on the curve specified by symbolic expressions $s_x$, $s_y$ on the interval $[t_1; t_2]$ using N-th order Taylor series expansion for the discretization tolerance $\varepsilon$ and correlation factor $\beta$:

```
function DISCRETIZATION(s_x, s_y, t_1, t_2, N, ε, β)
    x[0]←s_x
    y[0]←s_y
    for n←1;N do
        x[n]←DERIVE(x[n-1])
        y[n]←DERIVE(x[n-1])
    end for
    i←1
    t[i] t1
    for n←0, N do
        r_x[n]←EVALUATE(x[n]; t[i])
        r_y[n]←EVALUATE(y[n]; t[i])
    end for
    while t[i]<t2 do
        for n 0;N do
            r_x[n]←r'_x[n]
            r_y[n]←r'_y[n]
            r[n]←√(r_x[n]²+r_y[n]²)
        end for
        δ←DELTA(r, N, ε)
        if δ=0∨δ>t_2-t[i] then
            δ←t_2-t[i]
        end if
        repeat
            t[i+1]←t[i]+δ
            for n←0, N do
                r'_x[n]←EVALUATE(x[n]; t[i+1])
                r'_y[n]←EVALUATE(y[n]; t[i+1])
            end for
            ρ←rho(r_x, r_y, r'_x, r'_y, N, δ, β)
            ρ←δ/2
        until ρ<ε/2
        i←i+1
    end while
    return t
end function
```

Accordingly, step 1308 may also include performing the two functions defined below. The first function uses the bisection method to calculate the solution of the equation (17) given an array of N+1 values r[0 . . . N] corresponding to the coefficients $\|r^{(n)}(\tau_i)\|$ and the discretization tolerance $\varepsilon$:

```
function DELTA(r, N, ε)
    f←1
    δmax←0
    for m←2;N do
        f←mf
        if r[m]>0 then
            δ←(2fε/((m-1)r[m]))^(1/m)
            if δmax=0∨δ<δ_max then
                δ_max←δ
            end if
        end if
    end for
    if δ_max=0 then
        return 0
    else
        δmin←0
        while δ_max-δ_min>0 do
            δ←(δ_max+δ_min)/2
            f←δ
            g←-2ε
            for m←2;N do
                f←δ/m
                g←g+(m-1)fr[m]
            end for
            if g>0 then
                δ_max←δ
            else if g<0 then
                δ_min←δ
            else
                δ_max←δ_min
            end if
        end while
    end if
    return δ
end function.
```

The second function calculates the error estimate (30) given the discretization step $\delta$, the correlation factor $\beta$ and the arrays $r_x[0\ N]$, $r_y[0 \ldots N]$ and $r'_x[0 \ldots N]$, $r'_y[0 \ldots N]$ with the values of the curve functions and their derivatives at both ends of the interval $[\tau_i; \tau_i+\delta]$:

```
function RHO(r_x, r_y, r'_x, r'_y, N, δ, β)
    r_min ← -1
    r_max ← -1
    f ← 1 =
    for m ← N; 0 do
        r_x+ ← 0
        r_y+ ← 0
        r_x- ← 0
        r_y- ← 0
        for n ← N-m; 1 do
            r_x+ ← δ(r_x+ + r_x[m+n])/n
            r_y+ ← δ(r_y+ + r_y[m+n])/n
            r_x- ← δ(r_x- + r'_x[m+n])/n
            r_y- ← δ(r_y- + r'_y[m+n])/n
        end for
        r_x+ ← r'_x[m] - r_x[m] - r_x+
        r_y+ ← r'_y[m] - r_y[m] - r_y+
        r_x- ← r'_x[m] - r'_x[m] - r_x-
        r_y- ← r'_y[m] - r'_y[m] - r_y-
        r_+ ← √(r_x+² + r_y+²)
        r_- ← √(r_x-² + r_y-²)
        r ← f_max(r_+; r_-)
        if r_min < 0 ∨ r < r_min then
            r_min ← r
        end if
        if r_max < 0 ∨ r > r_max then
            r_max ← r
        end if
        f ← (N-m+2)f/δ
    end for
    g ← 2/β
    for n ← 1; N+1 do
        g ← gδ/n
    end for
    if r_min > 0 then
        return gr²_max/r_min
    else
        return gr_max
    end if
end function
```

Step 1310 includes transforming the parametrized curve into the discretized segmentation that includes the straight segment. In some embodiments, step 1310 includes modifying a register in the memory of the computer by replacing the equations in the parametrized curve (e.g., Eqs. 1.1, 8.1 and 9.1) by multiple numerical entries indicative of the coordinates of the nodes in the discretized segmentation (e.g., nodes 411 and segments 402, cf. FIGS. 4 and 11).

Step 1312 includes forming a mask for reproducing the integrated circuit using the partition of the parameter interval.

Figure 14:
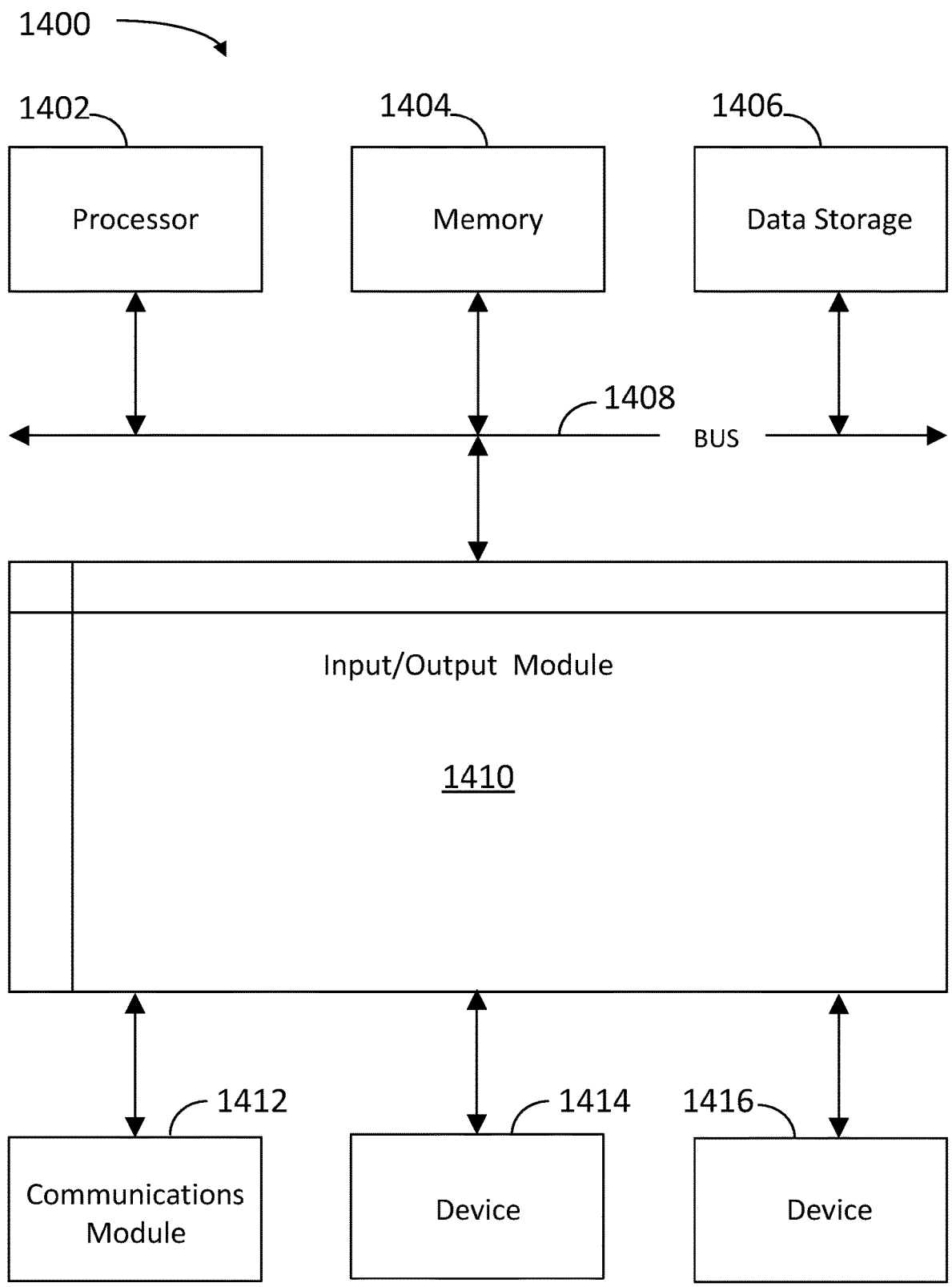
FIG. 14 is a block diagram illustrating an example computer system, according to some embodiments.

FIG. 14 is a block diagram illustrating an example computer system 1400 with which the methods and steps illustrated in FIGS. 12-13 can be implemented, according to some embodiments. In certain aspects, computer system 1400 can be implemented using hardware or a combination of software and hardware, either in a dedicated server, integrated into another entity, or distributed across multiple entities.

Computer system 1400 includes a bus 1408 or other communication mechanism for communicating information, and a processor 1402 coupled with bus 1408 for processing information. By way of example, computer system 1400 can be implemented with one or more processors 1402. Processor 1402 can be a general-purpose microprocessor, a microcontroller, a Digital Signal Processor (DSP), an Application Specific Integrated Circuit (ASIC), a Field Programmable Gate Array (FPGA), a Programmable Logic Device (PLD), a controller, a state machine, gated logic, discrete hardware components, or any other suitable entity that can perform calculations or other manipulations of information. In some embodiments, processor 1402 may include modules and circuits configured as a 'placing' tool or engine, or a 'routing' tool or engine, to place devices and route channels in a circuit layout, respectively and as disclosed herein.

Computer system 1400 includes, in addition to hardware, code that creates an execution environment for the computer program in question, e.g., code that constitutes processor firmware, a protocol stack, a database management system, an operating system, or a combination of one or more of them stored in an included memory 1404, such as a Random Access Memory (RAM), a flash memory, a Read Only Memory (ROM), a Programmable Read-Only Memory (PROM), an Erasable PROM (EPROM), registers, a hard disk, a removable disk, a CD-ROM, a DVD, or any other suitable storage device, coupled to bus 1408 for storing information and instructions to be executed by processor 1402. Processor 1402 and memory 1404 can be supplemented by, or incorporated in, special purpose logic circuitry.

The instructions may be stored in memory 1404 and implemented in one or more computer program products, e.g., one or more modules of computer program instructions encoded on a computer-readable medium for execution by, or to control the operation of, the computer system 1400, and according to any method well known to those of skill in the art, including, but not limited to, computer languages such as data-oriented languages (e.g., SQL, dBase), system languages (e.g., C, Objective-C, C++, Assembly), architectural languages (e.g., Java, .NET), and application languages (e.g., PHP, Ruby, Perl, Python). Instructions may also be implemented in computer languages such as array languages, aspect-oriented languages, assembly languages, authoring languages, command line interface languages, compiled languages, concurrent languages, curly-bracket languages, dataflow languages, data-structured languages, declarative languages, esoteric languages, extension languages, fourth-generation languages, functional languages, interactive mode languages, interpreted languages, iterative languages, list-based languages, little languages, logic-based languages, machine languages, macro languages, metaprogramming languages, multiparadigm languages, numerical analysis languages, non-English-based languages, object-oriented class-based languages, object-oriented prototype-based languages, off-side rule languages, procedural languages, reflective languages, rule-based languages, scripting languages, stack-based languages, synchronous languages, syntax handling languages, visual languages, Wirth languages, embeddable languages, and xml-based languages. Memory 1404 may also be used for storing temporary variable or other intermediate information during execution of instructions to be executed by processor 1402.

A computer program as discussed herein does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, subprograms, or portions of code). A computer program can be deployed to be executed on one computer or on multiple computers that are located at one site or distributed across multiple sites and interconnected by a communication network. The processes and logic flows described in this specification can be performed by one or more programmable processors executing one or more computer programs to perform functions by operating on input data and generating output.

Computer system 1400 further includes a data storage device 1406 such as a magnetic disk or optical disk, coupled to bus 1408 for storing information and instructions.

Computer system 1400 is coupled via input/output module 1410 to various devices. The input/output module 1410 is any input/output module. Example input/output modules 1410 include data ports such as USB ports. The input/output module 1410 is configured to connect to a communications module 1412. Example communications modules 1412 include networking interface cards, such as Ethernet cards and modems. In certain aspects, the input/output module 1410 is configured to connect to a plurality of devices, such as an input device 1414 and/or an output device 1416. Example input devices 1414 include a keyboard and a pointing device, e.g., a mouse or a trackball, by which a user can provide input to the computer system 1400. Other kinds of input devices 1414 are used to provide for interaction with a user as well, such as a tactile input device, visual input device, audio input device, or brain-computer interface device. For example, feedback provided to the user can be any form of sensory feedback, e.g., visual feedback, auditory feedback, or tactile feedback; and input from the user can be received in any form, including acoustic, speech, tactile, or brain wave input. Example output devices 1416 include display devices, such as an LED (light emitting diode), CRT (cathode ray tube), or LCD (liquid crystal display) screen, for displaying information to the user.

Methods as disclosed herein may be performed by computer system 1400 in response to processor 1402 executing one or more sequences of one or more instructions contained in memory 1404. Such instructions may be read into memory 1404 from another machine-readable medium, such as data storage device 1406. Execution of the sequences of instructions contained in main memory 1404 causes processor 1402 to perform the process steps described herein (e.g., as in methods). One or more processors in a multi-processing arrangement may also be employed to execute the sequences of instructions contained in memory 1404. In alternative aspects, hard-wired circuitry may be used in place of, or in combination with, software instructions to implement various aspects of the present disclosure. Thus, aspects of the present disclosure are not limited to any specific combination of hardware circuitry and software.

Various aspects of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. The communication network can include, for example, any one or more of a personal area network (PAN), a local area network (LAN), a campus area network (CAN), a metropolitan area network (MAN), a wide area network (WAN), a broadband network (BBN), the Internet, and the like. Further, the communication network can include, but is not limited to, for example, any one or more of the following network topologies, including a bus network, a star network, a ring network, a mesh network, a star-bus network, tree or hierarchical network, or the like. The communications modules can be, for example, modems or Ethernet cards.

Computing system 1400 includes servers and personal computer devices. A personal computing device and server are generally remote from each other and typically interact through a communication network. The relationship of client and server arises by virtue of computer programs running on the respective computers and having a client-server relationship to each other. Computer system 1400 can be, for example, and without limitation, a desktop computer, laptop computer, or tablet computer. Computer system 1400 can also be embedded in another device, for example, and without limitation, a mobile telephone, a personal digital assistant (PDA), a mobile audio player, a Global Positioning System (GPS) receiver, a video game console, and/or a television set top box.

The term "machine-readable storage medium" or "computer-readable medium" as used herein refers to any medium or media that participates in providing instructions or data to processor 1402 for execution. Such a medium may take many forms, including, but not limited to, non-volatile media, volatile media, and transmission media. Non-volatile media include, for example, optical disks, magnetic disks, or flash memory, such as data storage device 1406. Volatile media include dynamic memory, such as memory 1404. Transmission media include coaxial cables, copper wire, and fiber optics, including the wires that comprise bus 1408. Common forms of machine-readable media include, for example, floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH EPROM, any other memory chip or cartridge, or any other medium from which a computer can read. The machine-readable storage medium can be a machine-readable storage device, a machine-readable storage substrate, a memory device, a composition of matter effecting a machine-readable propagated signal, or a combination of one or more of them.

In one aspect, a method may be an operation, an instruction, or a function and vice versa. In one aspect, a clause or a claim may be amended to include some or all of the words (e.g., instructions, operations, functions, or components) recited in either one or more clauses, one or more words, one or more sentences, one or more phrases, one or more paragraphs, and/or one or more claims.

To illustrate the interchangeability of hardware and software, items such as the various illustrative blocks, modules, components, methods, operations, instructions, and algorithms have been described generally in terms of their functionality. Whether such functionality is implemented as hardware, software, or a combination of hardware and software depends upon the particular application and design constraints imposed on the overall system. Skilled artisans may implement the described functionality in varying ways for each particular application.

As used herein, the phrase "at least one of" preceding a series of items, with the terms "and" or "or" to separate any of the items, modifies the list as a whole, rather than each member of the list (e.g., each item). The phrase "at least one of" does not require selection of at least one item; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

In one aspect, a term field effect transistor (FET) may refer to any of a variety of multi-terminal transistors generally operating on the principals of controlling an electric field to control the shape and hence the conductivity of a channel of one type of charge carrier in a semiconductor material, including, but not limited to, a metal oxide semiconductor field effect transistor (MOSFET), a junction FET (JFET), a metal semiconductor FET (MESFET), a high electron mobility transistor (HEMT), a modulation doped FET (MODFET), an insulated gate bipolar transistor (IGBT), a fast reverse epitaxial diode FET (FREDFET), and an ion-sensitive FET (ISFET).

To the extent that the term "include," "have," or "the like" is used in the description or the claims, such term is intended to be inclusive in a manner similar to the term "comprise" as "comprise" is interpreted when employed as a transitional word in a claim.

The word "exemplary" is used herein to mean "serving as an example, instance, or illustration." Any embodiment described herein as "exemplary" is not necessarily to be construed as preferred or advantageous over other embodiments. Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A reference to an element in the singular is not intended to mean "one and only one" unless specifically stated, but rather "one or more." The term "some" refers to one or more. Underlined and/or italicized headings and subheadings are used for convenience only, do not limit the subject technology, and are not referred to in connection with the interpretation of the description of the subject technology. Relational terms such as first and second and the like may be used to distinguish one entity or action from another without necessarily requiring or implying any actual such relationship or order between such entities or actions. All structural and functional equivalents to the elements of the various configurations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description. No claim element is to be construed under the provisions of 35 U.S.C. § 112, sixth paragraph, unless the element is expressly recited using the phrase "means for" or, in the case of a method claim, the element is recited using the phrase "step for."

While this specification contains many specifics, these should not be construed as limitations on the scope of what may be claimed, but rather as descriptions of particular implementations of the subject matter. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

The subject matter of this specification has been described in terms of particular aspects, but other aspects can be implemented and are within the scope of the following claims. For example, while operations are depicted in the drawings in a particular order, this should not be understood as requiring that such operations be performed in the particular order shown or in sequential order, or that all illustrated operations be performed, to achieve desirable results. The actions recited in the claims can be performed in a different order and still achieve desirable results. As one example, the processes depicted in the accompanying figures do not necessarily require the particular order shown, or sequential order, to achieve desirable results. In certain circumstances, multitasking and parallel processing may be advantageous. Moreover, the separation of various system components in the aspects described above should not be understood as requiring such separation in all aspects, and it should be understood that the described program components and systems can generally be integrated together in a single software product or packaged into multiple software products.

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirements of the applicable patent law, nor should they be interpreted in such a way.

What is claimed is:
1. A computer-implemented method, comprising:
  receiving a parametrized curve indicative of a feature in an integrated circuit;
  selecting a first parameter value associated with a first point in the parametrized curve;

determining a pre-selected number of derivative values in a Taylor series for the parametrized curve at the first point;

determining a second parameter value for a second point in the parametrized curve based on the pre-selected number of derivative values;

determining a threshold error value between a straight segment joining the first point and the second point, and the parametrized curve;

modifying the second parameter value based on the threshold error value and a pre-selected tolerance;

transforming the parametrized curve into a discretized segmentation that comprises the straight segment joining the first point and the second point; and providing the discretized segmentation of the parametrized curve to manufacture a mask for reproducing the feature in the integrated circuit.

2. The computer-implemented method of claim 1, wherein determining a second parameter value comprises determining an increment added to the first parameter value, the increment associated with the pre-selected number of derivative values.

3. The computer-implemented method of claim 1, wherein modifying the second parameter value comprises reducing an increment between the second parameter value and the first parameter value, when the threshold error value is larger than the pre-selected tolerance.

4. The computer-implemented method of claim 1, wherein modifying the second parameter value comprises enlarging an increment added to the first parameter value when the threshold error value is smaller than the pre-selected tolerance.

5. The computer-implemented method of claim 1, wherein modifying the second parameter value based on the threshold error value and a pre-selected tolerance comprises reducing a difference between the second parameter value and the first parameter value based on a deviation between the Taylor series for the parametrized curve and the parametrized curve.

6. The computer-implemented method of claim 1, further comprising forming a partition of a parameter interval, the partition comprising the first parameter value and the second parameter value, wherein modifying the second parameter value comprises separating the second parameter value from the first parameter value and ensuring that the threshold error value is smaller than the pre-selected tolerance.

7. The computer-implemented method of claim 1, further comprising forming a second discretized segmentation of a second parametrized curve, wherein the second parametrized curve is a parallel translation of the parametrized curve.

8. The computer-implemented method of claim 1, further comprising verifying that no artifacts are present in the discretized segmentation of the parametrized curve, wherein the artifacts comprise a cusp or an intersection.

9. The computer-implemented method of claim 1, further comprising identifying an artifact in the discretized segmentation of the parametrized curve and removing a parameter value within the artifact.

10. The computer-implemented method of claim 1, wherein providing the discretized segmentation comprises providing a sequence of multiple point coordinates to a mask manufacturer, wherein the sequence of multiple point coordinates define the discretized segmentation of the parametrized curve with straight segments joining the sequence of multiple point coordinates.

11. A system, comprising:
a memory storing instructions; and
one or more processors configured to execute the instructions to cause the system to:
receive a parametrized curve indicative of a feature in an integrated circuit;
select a first parameter value associated with a first point in the parametrized curve;
determine a pre-selected number of derivative values in a Taylor series for the parametrized curve at the first point;
determine a second parameter value for a second point in the parametrized curve based on the pre-selected number of derivative values;
determine a threshold error value between a straight segment joining the first point and the second point, and the parametrized curve;
modify the second parameter value based on the threshold error value and a pre-selected tolerance;
transform the parametrized curve into a discretized segmentation that includes the straight segment joining the first point and the second point; and
provide the discretized segmentation of the parametrized curve to manufacture a mask for reproducing the feature in the integrated circuit.

12. The system of claim 11, wherein to determine a second parameter value the one or more processors are further configured to determine an increment added to the first parameter value, the increment associated with the pre-selected number of derivative values.

13. The system of claim 11, wherein to modify the second parameter value the one or more processors are configured to reduce an increment between the second parameter value and the first parameter value, when the threshold error value is larger than the pre-selected tolerance.

14. The system of claim 11, wherein to modify the second parameter value the one or more processors are configured to enlarge an increment added to the first parameter value when the threshold error value is smaller than the pre-selected tolerance.

15. The system of claim 11, wherein to modify the second parameter value based on the threshold error value and a pre-selected tolerance the one or more processors are configured to reduce a difference between the second parameter value and the first parameter value based on a deviation between the Taylor series for the parametrized curve and the parametrized curve.

16. The system of claim 11, wherein the one or more processors are configured to form a partition of a parameter interval, the partition comprising the first parameter value and the second parameter value, and wherein to modify the second parameter value the one or more processors are configured to separate the second parameter value from the first parameter value and ensuring that the threshold error value is smaller than the pre-selected tolerance.

17. A computer-implemented method, comprising:
providing a parametrized curve indicative of a feature in an integrated circuit;
selecting a number of derivative values in a Taylor series to form a partition of a parameter interval;
selecting a tolerance for a threshold error value between a straight segment in a discretized segmentation of the parametrized curve and the parametrized curve;
modifying the tolerance based on a number of elements in the partition of the parameter interval;
transforming the parametrized curve into the discretized segmentation that comprises the straight segment; and forming a mask layout for reproducing the integrated circuit using the discretized segmentation.

18. The computer-implemented method of claim 17, wherein selecting a number of derivative values in a Taylor series to form a partition of a parameter interval comprises selecting a derivative value that is different from zero in the Taylor series.

19. The computer-implemented method of claim 17, wherein modifying the tolerance based on a number of elements in the partition of the parameter interval comprises increasing the tolerance to reduce the number of elements in the partition of the parameter interval.

20. The computer-implemented method of claim 17, further comprising increasing the number of derivative values in the Taylor series to reduce the threshold error value between the straight segment in a discretized segmentation of the parametrized curve and the parametrized curve.

* * * * *